(12) United States Patent
King et al.

(10) Patent No.: US 12,078,728 B2
(45) Date of Patent: *Sep. 3, 2024

(54) HIGH DYNAMIC RANGE SINGLE PHOTON AVALANCHE DETECTOR ARRAY ON SILICON WITH CIRCUITRY FOR LIGHT DETECTION AND RANGING

(71) Applicant: SEMIKING LLC, Gloucester, MA (US)

(72) Inventors: Clifford Alan King, Gloucester, MA (US); Anders Ingvar Aberg, Staffanstorp (SE)

(73) Assignee: Semiking LLC, Gloucester, MA (US)

( * ) Notice: Subject to any disclaimer, the term of this patent is extended or adjusted under 35 U.S.C. 154(b) by 706 days.

This patent is subject to a terminal disclaimer.

(21) Appl. No.: 17/244,135

(22) Filed: Apr. 29, 2021

(65) Prior Publication Data

US 2021/0341619 A1 Nov. 4, 2021

Related U.S. Application Data

(60) Provisional application No. 63/117,631, filed on Nov. 24, 2020, provisional application No. 63/033,315, (Continued)

(51) Int. Cl.
*G01S 17/894* (2020.01)
*G01S 7/4863* (2020.01)
(Continued)

(52) U.S. Cl.
CPC .......... *G01S 17/894* (2020.01); *G01S 7/4863* (2013.01); *H01L 27/14625* (2013.01);
(Continued)

(58) Field of Classification Search
CPC ...... G01S 17/894; G01S 7/4863; G01S 17/10; H04N 5/33; H01L 27/14612;
(Continued)

(56) References Cited

U.S. PATENT DOCUMENTS 9,419,635 B2* 8/2016 Kumar ................. G04F 10/005
2015/0285625 A1* 10/2015 Deane ................... G01S 7/4817
348/140

(Continued)

FOREIGN PATENT DOCUMENTS

JP 2019015522 A * 1/2019

*Primary Examiner* — Jennifer D Bennett
(74) *Attorney, Agent, or Firm* — Sunstein LLP

(57) ABSTRACT

An image sensor array includes a substrate and a plurality of pixels. Each pixel includes a single photon avalanche detector (SPAD), a quench device coupled to a respective SPAD and configured to quench an avalanche current, and time measurement circuitry configured to measure a time-of-flight of a photon. The SPAD has a trench coupled to the substrate and having a lattice mismatch with the substrate, and a substantially defect-free region coupled to the trench and configured to generate the avalanche current when the photon is detected in the defect-free region, wherein the trench and the defect-free region form an electrode. An imaging system includes an infrared laser configured to provide a pulse of light, and the image sensor array configured to receive the pulse from the infrared laser.

20 Claims, 17 Drawing Sheets

Related U.S. Application Data filed on Jun. 2, 2020, provisional application No. 63/017,292, filed on Apr. 29, 2020.

(51) Int. Cl.
| | |
|---|---|
| *H01L 27/146* | (2006.01) |
| *H01L 31/02* | (2006.01) |
| *H01L 31/107* | (2006.01) |
| *H04N 5/33* | (2023.01) |

(52) U.S. Cl.
CPC ...... *H01L 31/02027* (2013.01); *H01L 31/107* (2013.01); *H04N 5/33* (2013.01)

(58) Field of Classification Search
CPC ......... H01L 27/14625; H01L 27/14636; H01L 31/02327; H01L 31/107; H01L 31/02027; H01L 31/1892
See application file for complete search history.

(56) References Cited

U.S. PATENT DOCUMENTS

| | | | |
|---|---|---|---|
| 2018/0061883 A1* | 3/2018 | Na | H01L 27/14652 |
| 2018/0211990 A1* | 7/2018 | Yorikado | H01L 27/14636 |
| 2018/0364340 A1* | 12/2018 | Ichiyanagi | G01S 7/4814 |
| 2020/0058697 A1* | 2/2020 | Meylan | H01L 27/1465 |
| 2020/0286946 A1* | 9/2020 | Mandai | G01S 7/4863 |
| 2021/0343762 A1* | 11/2021 | King | H01L 27/14612 |

\* cited by examiner

HIGH DYNAMIC RANGE SINGLE PHOTON AVALANCHE DETECTOR ARRAY ON SILICON WITH CIRCUITRY FOR LIGHT DETECTION AND RANGING

CROSS REFERENCE TO RELATED APPLICATIONS

The present application claims the benefit of U.S. Provisional Patent Application No. 63/017,292 filed Apr. 29, 2020, U.S. Provisional Patent Application No. 63/033,315 filed Jun. 2, 2020, and U.S. Provisional Patent Application No. 63/117,631 filed Nov. 24, 2020, the disclosures of which are incorporated by reference herein in their entirety.

BACKGROUND OF THE INVENTION

Field of the Invention

This invention relates to a single photon avalanche detector array fabricated on a silicon wafer with circuitry to form a receiver for a light detection and ranging system or medical imaging system that is sensitive to radiation in the visible to shortwave infrared spectral region.

Discussion of the Related Art

Image sensors capable of creating images in the infrared spectral region, especially shortwave infrared (SWIR), are important in a wide variety of applications including fiber optic communications, light detection and ranging (LiDAR), silicon integrated circuit manufacturing, infrared microscopy, solar cell manufacturing, imaging through smoke and fog, night vision for security, night vision for military uses, imaging military laser target designators, art conservation, astronomy, pollution detection, and infrared spectroscopy. Medical applications including cancer detection, pharmaceutical manufacturing, coronary surgery, and the early detection of dental caries also benefit from images created using shortwave infrared illumination.

In particular, LiDAR is applicable for advanced driver-assistance systems (ADAS) to aid in the safe navigation of motor vehicles. Current systems use near infrared (NIR) wavelengths (750-1100 nm) or SWIR wavelengths (1100-2500 nm) to gather time-of-flight information from probing laser illumination. The human eye can focus visible light and infrared light with a wavelength less than 1400 nm on the retina. This ability to focus poses an inherent danger to human sight if the laser illumination levels used in the LiDAR system exceed the maximum permissible exposure (MPE). To remain "eye safe," power from an NIR laser at 905 nm must be limited by a factor $10^5$ to $10^6$ compared to SWIR laser illumination with a wavelength above 1400 nm at pulse widths between 1 ns and 1 μs. Direct detection time-of-flight (TOF) LiDAR systems usually use a narrow pulse width between 1 and 100 ns to preserve measured range accuracy and dynamic range. The ability to use a safe higher power laser illumination source increases the range performance of the LiDAR system given equally capable receivers.

In addition, LiDAR for use in outdoor conditions needs to contend with noise from solar radiation which can be mistaken for a reflected laser photon. The irradiance of solar radiation at 1540 nm is only 59 percent of the value at 905 nm yielding another important advantage for using illumination sources above 1400 nm. Illumination in the shortwave infrared above 1400 nm allows eye safety at higher power levels and lower ambient noise from the sun. An inexpensive image sensor capable of viewing such an illumination source is of great value to LiDAR systems for automotive applications since human observers will be in close proximity to the light source.

A typical image sensor comprises a two-dimensional array of picture elements (pixels) including photodetectors, transistors, capacitors, and metal interconnects. The photodetectors in each pixel sense the incoming radiation and convert the incident photons into electrons. The accompanying electrical components in each pixel (e.g., transistors) quantitatively evaluate the intensity of the incoming radiation and output proportional electrical values to downstream circuitry which combines the pixels to form an image. In the case of a single photon avalanche detector (SPAD), a digital signal is sent to the downstream circuitry indicating the detection of an incoming photon.

Two-dimensional photodiode arrays, or focal plane arrays (FPAs) as they are known to practitioners in the infrared imaging field, require separate semiconductor chips to form an image sensor. In these devices, each pixel within the FPA is mated via an indium bump bond to a connection on a silicon readout integrated circuit (ROIC). The ROIC contains the necessary circuitry to accept the photodetector signal and render an image. For most SWIR infrared imagers, this bump bonding requirement comes about because today's photodetectors use compound semiconductor materials such as InGaAs, InSb, and HgCdTe that are incompatible with silicon processing. The resultant hybrid image sensor formed by this bonding process exhibits problems with reliability, semiconductor manufacturing yield, chip size, and most importantly high cost. The size of the indium bump itself limits pixel dimensions thus electronic innovations accomplished in related fields such as CMOS scaling cannot be used to their fullest extent. Hybrid bonding using copper pads partially alleviates the pixel dimension problem, but individual chips still must be bonded to the ROIC wafer. Therefore, a silicon chip where these concerns are minimized or eliminated would be beneficial.

One solution is to use a germanium based semiconductor material. However, germanium has a 4 percent lattice mismatch to silicon rendering a highly defective layer when epitaxially grown directly on silicon. Minority carrier p-n junction devices fabricated in this Ge material possess very high dark current and thus high noise. The high noise of these devices makes them useless for high performance LiDAR and for photon starved applications like low light imaging. To address these important applications at low cost, a method to produce high quality Ge-on-Si was developed by Noble Peak Vision Corp.

A single silicon chip visible-to-shortwave infrared image sensor using nearly defect free germanium has been disclosed. The photodiode process used a photosensitive material in the visible-to-shortwave spectral region, epitaxially grown on a silicon substrate, as further described in U.S. Pat. Nos. 7,012,314 and 7,297,569. The process uses selective epitaxial growth to form nearly defect free regions on the silicon substrate after the components of the ROIC are substantially in place. The process may use single crystal germanium as the photosensitive material. U.S. Pat. No. 7,453,129, describes how an array of such integrated elements can be combined to form an image sensor.

The photodiode element of the germanium image sensor described above includes a p-n junction biased with a small reverse voltage to limit the dark current which adds noise to the collected signal current. The signal current created by the incident visible and SWIR radiation is integrated during a video frame time and manifested as charge collected on the photodiode. The magnitude of the charge is proportional to the signal incident upon the junction, but it also contains the integrated dark current which degrades the signal-to-noise ratio. The anode and cathode exist horizontally spaced apart from each other on the device.

A simple photodetector using these nearly defect-free semiconductor regions yields low dark current, but does not have enough sensitivity for long range LiDAR applications. To improve the sensitivity of a p-n junction, the photodetector may be operated in avalanche mode whereby electronic gain is realized by the creation of many electron-hole pairs through impact ionization. Furthermore, the device may be operated in single photon or "Geiger" mode where it is biased beyond the breakdown voltage allowing the absorption of a single photon to initiate avalanche multiplication and create a large current.

SUMMARY OF THE EMBODIMENTS

The fabrication of a germanium single photon avalanche detector (SPAD) array begins with a conventional silicon complementary metal oxide semiconductor (CMOS) process and is interrupted after the formation of the first metal via. Nearly defect free germanium isolated regions are formed through selective epitaxial growth and chemical mechanical polishing on the CMOS silicon wafer.

The SPAD is made with CMOS compatible steps including selective epitaxial growth, ion implantation, and low temperature dielectric deposition. The high aspect ratio seed trench is formed on an n-well region formed in the substrate and serves as the cathode contact to the SPAD. The Ge seed epitaxial growth is in-situ doped with phosphorous to ensure electrical continuity to the n-well region. The n-well region extends within the substrate underneath the Ge region allowing it to be contacted with an n+ source/drain region and backend metallization as conventionally achieved to CMOS transistors.

To form the important doped regions of the Ge SPAD device, ion implantation and subsequent annealing of the resulting damage is accomplished using methods well known to those skilled in the art. To protect the sensitive Ge surface from contamination during photolithography and ion implantation steps, a thin screen oxide is deposited on the substantially defect-free, single crystal Ge surface. Blanket phosphorous implants without any photolithographic patterning ensure the Ge region above the seed region is lightly doped n-type. The resulting doping concentration from the blanket implants needs to overcome the background concentration from the epitaxial growth. In one embodiment, a blanket heavily doped p-type region is implanted to form the anode of the device. The p-n junction in this structure takes up the entirety of the substantially defect-free Ge region and intersects with the sidewalls of the oxide well. This structure has a high fill factor, but in order to suppress the dark count rate (DCR) the oxide sidewall interface must be high quality with low interface trap density and low interface charge. In an alternative structure, a circular or near circular patterned heavily p-type doped region is made to form the anode and an additional n-type implant with phosphorous and/or arsenic is added within the same lithographic pattern in the center area of the substantially defect-free, single crystal Ge region. In this case, the p-n junction occupies a smaller portion of the substantially defect-free Ge region and intersects with the top surface of the Ge region. A second circular or nearly circular pattern may also be added which is concentric with, but larger than the prior pattern in which one or more boron implants are added to tailor the lateral field profile to prevent premature breakdown in the device. This type of pattern may be referred to as a guard ring, which is shown and described below in FIG. 2. The n-type region outside the circularly patterned region is lightly doped to minimize the electric field and suppress impact ionization. This structure possesses a lower fill factor but has the sensitive p-n junction exposed to the top surface where it is much simpler to form a high quality oxide interface with the Ge region. A final patterned implant with boron or gallium may be used to create a more heavily doped p-type region within the anode area to allow a low resistance ohmic contact. This implant should have a low enough energy that the electric field profile near the p-n junction is not affected.

Once the ion implantation steps are completed, the screen oxide is chemically stripped with a dilute solution of hydrofluoric acid and replaced with a thin deposited oxide. A rapid thermal anneal (RTA) removes any damage to the crystalline structure of the Ge due to the ion implantation. A low temperature thermal oxidation with the deposited oxide in place is undertaken next to form a $Ge/GeO_2$ interface with a low interface trap density to minimize the DCR. Another deposited oxide serves to act as a thick dielectric to separate the SPAD active region from the subsequent metal contact. A contact window is lithographically fabricated and etched. To complete the device fabrication, a conventional interlevel metallization process is executed to make contact to the SPAD.

The optimum device structure for single photon detection operation deviates substantially from the form used for standard imaging applications. The equivalent performance parameter of dark current for a SPAD device is the dark count rate (DCR) expressed in Hz which characterizes the rate of electron-hole pairs generated in the detector that originate an avalanche multiplication event. Likewise, the equivalent performance parameter for quantum efficiency is the probability of detection efficiency (PDE) which accounts for both the absorption of an incoming photon to create an electron-hole pair as well as the initiation of an avalanche multiplication event. In embodiments of the present invention, the multiplication event occurs in the substantially defect-free region 40, 42, unlike the prior art where the multiplication event occurs in the n-well formed in the substrate.

A SPAD device combined with its quenching electronic element (resistor or transistor) and pulse generator (inverter or comparator) circuit is inherently a digital device. The circuit complexity of a range finding SPAD sensor array is high due to a larger transistor count necessary to obtain a precise measurement of the laser pulse time-of-flight. The electrical connections between the SPAD and time measuring electronics require nearly identical delays to avoid complicated calibration procedures. Without identical wiring path lengths from the SPAD to the time measurement circuit, it is difficult to obtain correct values for range consistently across an entire array of SPAD sensors. Since identical delays come about from these equal length connections, the pixel must be self-contained with all the components necessary to capture the photon pulse and measure the time-of-flight. Purely digital time measurement solutions grow the pixel size substantially and make the pixel pitch excessively large in a two-dimensional array. Stacking of silicon chips through copper-to-copper (Cu2Cu) bonding by placing the sensor (photodiode with readout circuitry) and image processing chips on different layers is an effective method to attain a small pixel size for a purely digital time measurement pixel as well. Analog techniques using precision metal-insulator-metal capacitors afford the ability for time-of-flight measurement to be included within the pixel without wafer bonding using relatively inexpensive CMOS nodes. Such a receiver array is important for automotive LiDAR applications since a "flash" mode is possible where the entire scene is illuminated at once without the need for complicated scanning mechanisms. These scanning mechanisms introduce reliability problems due to moving parts and complicate the system manufacturing process through the need for sophisticated alignment techniques of the transmitting laser and the receiving photodiode. Combining an analog time-of-flight measurement in-pixel with a low defect density Ge-on-Si SPAD structure allows a low-cost LiDAR operating at shortwave infrared wavelengths utilizing the large existing silicon-based manufacturing infrastructure.

The SPAD array architecture of embodiments of the present invention discloses pixels with a single SPAD or multiple SPADs coupled to a time-to-analog converter (TAC) or a time-to-digital converter (TDC) measurement circuit. In this application, parallel connected SPADs and their individually connected quench devices (transistor or resistor) are termed a solid state photomultiplier (SSPM). The array geometry includes m rows by n columns where the simplest configuration has one or two columns (n=1 or n=2) with several rows thus arranged in a one-dimensional or nearly one-dimensional fashion. Two-dimensional arrays where m and n are comparable are also possible, but the pixel pitch will heavily depend on whether a TAC or TDC is used as the time measurement circuit. The TAC has fewer elements and uses a readout scheme similar to CMOS image sensors to transmit the time-of-flight information thus it will render a smaller pixel pitch capable of producing a two-dimensional array in 180 nm CMOS technology. Furthermore, Cu2Cu wafer bonding will reduce the pixel pitch of a two-dimensional array for both time measurement architectures but will increase device cost.

Arrays may have combinations of the elements previously discussed including the number of SPAD devices per pixel, the time measurement circuit architecture, and the use of wafer bonding.

One embodiment of the image sensor includes a one or two-dimensional array having a single SPAD in each pixel accompanied by a quench transistor and a CMOS inverter element to provide an input pulse to a TAC. The TAC includes logic circuitry at its input and capacitive elements at its output to accumulate charge proportional to time. In another embodiment the CMOS inverter element is replaced with a comparator circuit as an alternative coupling method to the logic. This comparator circuit allows a set of parallel connected SPADs (solid state photomultiplier) to be coupled to the TAC thus increasing the dynamic range of the pixel with the penalty of larger pixel pitch. When an incoming photon successfully initiates an avalanche event in a SPAD, it cannot detect another photon until the avalanche current is quenched and the diode recharged. This quench/recharge period is termed the dead time of the device. By using multiple SPADs within a pixel, the probability of being blinded to incoming photons is reduced exponentially thus improving the dynamic range. Increased dynamic range is especially important when operating in high background light conditions such as bright sunlight outdoors. In another embodiment, the array configuration may use Cu2Cu wafer bonding to place the SPAD elements (single or multiple) in an upper layer and the TAC components in a lower CMOS layer. This division permits the pixel pitch to be reduced thus improving the fill factor and the instantaneous field-of-view of the pixel at the system level. In this arrangement, the SPAD devices are in a wafer on the top tier which is bonded to another wafer containing the quench electronics, the pulse generator, the time measurement circuit, the data readout, as well as any other electronics used to improve the range and image performance. Separation of the SPAD from the other electronic components dramatically increases the fill factor of the pixel and permits different CMOS nodes to be implemented for the detector and accompanying electronics. As an example, the SPAD could use a 180 nm CMOS node with top metal copper backend to save on cost while the electronics could use a more advanced node to decrease pixel size and improve time measurement performance since the transistor size is reduced, and the electrical performance is increased in the advanced node. The only requirement is that both technology nodes use copper as the top metal layer to permit the use of the high density wafer bonding process. It is also possible to include on chip image processing functions such as histogram creation, non-uniformity correction, nearest neighbor photon detection correlation or other calculation tasks to improve data and image quality.

The same SPAD array architecture forms as described above for the TAC timing circuit can be applied to arrays using a TDC. Because of the larger number of components in the TDC compared to the TAC circuit, larger pixel pitches result making the one-dimensional array preferable. The first form starts with a one-dimensional array of single SPAD detectors, quench devices, and pulse generator circuits connected to TDC circuitry necessary to measure the photon time-of-flight. This architecture allows a maximum of two rows to maintain equivalent length electrical connections between the detector circuitry and the TDC. To keep the chip area low, a TDC with highly efficient size, high measurement accuracy and precision is required. A circuit based on a ring oscillator and ripple counter provides an avenue to achieve this goal. The circuitry needed to readout the data produced from each pixel may also be included on chip. The single SPAD within each pixel can be replaced with multiple SPADs connected in parallel and linked to the TDC through a comparator circuit as described above. Finally, an m×n array may be formed with single or multiple SPADs linked to a quench device, threshold detector, and TDC using a high density wafer bonding technique. As described above with the Cu2Cu wafer bonding process, it is also possible to include on chip image processing functions such as histogram creation, non-uniformity correction, nearest neighbor photon detection correlation or other calculation tasks to improve data and image quality in the lower tier wafer.

Embodiments of the present invention include two-dimensional SPAD arrays, which can be combined with a laser to create an eye safe "flash" LiDAR system where range data from the entire field-of-view is collected in a single laser pulse. In one embodiment, the laser may be an erbium glass diode pumped laser, although other lasers may also be used. This capability is highly desired for automotive LiDAR applications since it does not require any moving parts as there is no need to scan the illumination laser. Automotive customers are extremely concerned about the reliability of sensor systems and thus the exclusion of moving parts within an assembly is very advantageous. Nevertheless, this array also has benefits in systems where the laser is scanned because there is no need for the detector array to follow the scanning laser. Scanning systems using a dedicated detector aligned to an illumination source's instantaneous field-of-view must wait for the return pulse before proceeding to the next portion of the field-of-view. This obligation slows down the data collection and the ultimate frame rate of the system.

The array as described above is fixed in position and thus is capable of receiving laser pulses from any range.

In accordance with one embodiment of the present invention, an image sensor array includes a substrate and a plurality of pixels. Each pixel includes a single photon avalanche detector (SPAD), a quench device coupled to a respective SPAD and configured to quench an avalanche current, and time measurement circuitry configured to measure a time-of-flight of a photon. The SPAD has a trench coupled to the substrate and having a lattice mismatch with the substrate, and a substantially defect-free region coupled to the trench and configured to generate the avalanche current when the photon is detected in the defect-free region, wherein the trench and the defect-free region form an electrode of the SPAD, e.g., the cathode or the anode.

In some embodiments, the lattice mismatch may cause a dislocation defect which ends at a sidewall of the trench. The trench may have an aspect ratio of at least 1.7 times higher than its width. The substrate may include silicon. The trench may include germanium or a germanium alloy. At least one pixel includes a plurality of single photon avalanche detectors and a plurality of quench devices. Each quench device may be coupled to its respective SPAD and the plurality of single photon avalanche detectors may be coupled to one another in parallel. The time measurement circuitry may be a time-to-analog converter or a time-to-digital converter. The quench device may be a transistor or resistor. The SPAD may be on a first wafer and the quench device and the time measurement circuitry may be on a second wafer, and the first wafer is bonded to the second wafer. The first wafer may be bonded to the second wafer using a copper-to-copper bonding. Each pixel may further include a pulse generator configured to provide a signal to the time measurement circuitry. The pulse generator may be an inverter or comparator. The time measurement circuitry may further include a ring oscillator configured to activate or deactivate upon a pulse received from the SPAD. The ring oscillator may be operated in reverse mode or forward mode, and the time measurement circuitry may be configured to switch the ring oscillator between the reverse mode and the forward mode. The plurality of pixels may be arranged in an m by n array, and the image sensor array may further include a column multiplexer configured to receive data from the time measurement circuitry and to output range data. The image sensor array may further include a row decoder configured to select a row of the plurality of pixels and to read a charge on the respective time measurement circuitry, and column capacitor/amplifier circuitry configured to read the charge on the respective time measurement circuitry.

In accordance with another embodiment of the present invention, an imaging system includes an infrared laser configured to provide a pulse of light and the image sensor array disclosed above configured to receive the pulse from the infrared laser. In some embodiments, at least one pixel may include a plurality of single photon avalanche detectors coupled in parallel to one another. The image sensor array may detect range data from a field of view in a single pulse from the infrared laser. The infrared laser may have a period of greater than 2.67 microseconds.

BRIEF DESCRIPTION OF THE DRAWINGS

Embodiments of the present invention, together with its various features and advantages, can be readily understood from the following more detailed description taken in conjunction with the accompanying drawings, in which.

DETAILED DESCRIPTION OF EMBODIMENTS

In this application, an array of single photon avalanche detectors (SPADs) coupled with accompanying electronics are disclosed to make an integrated LiDAR receiver or time correlated single photon counting (TCSPC) image sensor for visible-to-shortwave infrared radiation. The SPAD is made using a semiconductor region integrated on a silicon wafer sensitive to shortwave infrared radiation with cutoff wavelengths up to 2500 nm. The exemplary device uses germanium as the semiconductor material and forms a substantially defect-free, single crystal region compatible with a conventional CMOS process using a method, such as methods disclosed in U.S. Pat. Nos. 7,012,314 and 7,297,569, which are incorporated by reference herein in their entirety, in which nearly defect free germanium isolated regions are formed through selective epitaxial growth and chemical mechanical polishing. Although the description below describes germanium as the trench and substantially defect-free region, other semiconductor materials may also be used and processes other than CMOS may also be used. If a CMOS or bipolar-CMOS (BiCMOS) process is chosen as the core, the process starts by fabricating both the CMOS and bipolar devices. One skilled in the art of making CMOS and bipolar devices can readily complete the details for such an effort.

Figure 1:
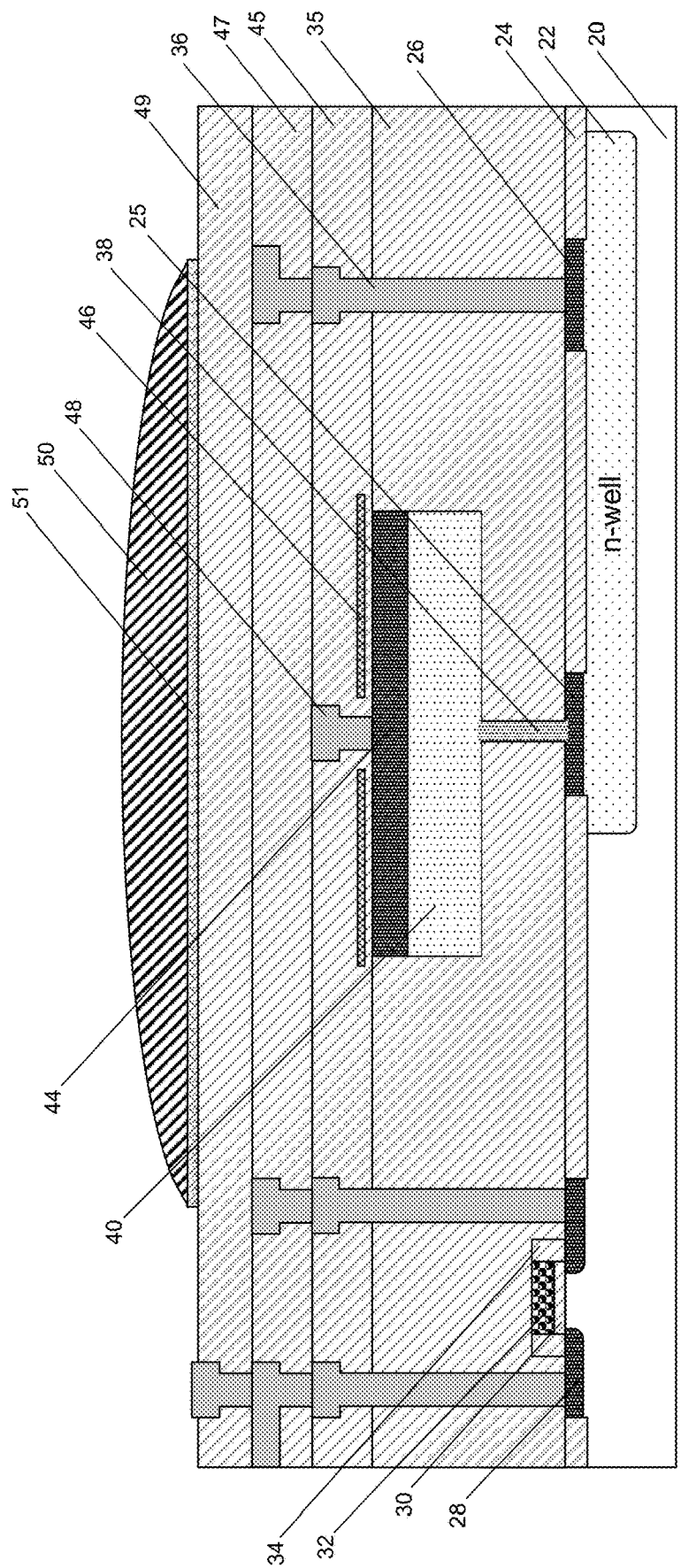
FIG. 1 is a schematic cross-sectional view of a completed high fill factor SPAD device structure according to embodiments of the present invention with the p-n junction intersecting the sidewall oxide interface and a conventional MOS transistor.

One embodiment of the complete device structure up to the third metal layer is illustrated in FIG. 1. The foundation of the device rests on the substrate 20 as well as other conventional CMOS regions including n-well 22, shallow trench isolation 24, n+/p+ source/drain 26 over n-well 22, n+/p+ source/drain 28 over substrate 20, gate oxide 30, transistor gate 32, and gate oxide sidewall spacer 34. The n-well 22 is junction isolated from the substrate 20 and serves as a means of connecting to the cathode (shown as elements 40 and 38 in FIG. 1) of the SPAD device. The n+ regions 25 and 26 aid in the formation of a low resistance contact to the n-well 22. Oxide 35 is composed of conventional CMOS interlevel metal dielectrics and is used to make the high aspect ratio germanium trench 38 on the n+Si region 25 and the substantially defect-free single crystal germanium well region 40, which is coupled to the trench 38. The trench 38 is in-situ doped n-type during a selective epitaxial growth process to a level between $5 \times 10^{14}$ and $1 \times 10^{19}$ cm$^{-3}$ with phosphorus or arsenic. It is desirable to have it doped as highly as possible consistent with maintaining good selectivity to growth on the surrounding oxide. The substantially defect-free single crystal Ge region 40 is not intentionally doped during the growth process and the background concentration depends primarily on the quality of source pre-cursor gases.

Ion implantation and rapid thermal annealing are used to form the regions 40, 44 of the SPAD device. To initially dope the substantially defect-free single crystal Ge region 40, phosphorus and/or arsenic blanket implants achieve a doping density necessary to overcome the background concentration from the epitaxial growth and form a main portion of the cathode of the SPAD device. A heavily doped p-type region 44 is implanted with boron to form the anode of the SPAD device. This device structure possesses a high fill factor but has the p-n junction bounded by the sidewall of the oxide 35 making it more difficult to passivate the interface. Once the ion implantation steps are completed, a rapid thermal anneal (RTA) at 600° C. for 20 seconds in a nitrogen ambient is performed to remove any damage to the crystalline structure of the Ge due to the ion implantation. Next a low temperature thermal oxidation with the deposited oxide in place is undertaken at 550-600° C. in dry oxygen for 2 to 45 minutes to form a Ge/GeO$_2$ interface with a low interface trap density to minimize the DCR. After the thermal oxidation, oxide 45 and photon scattering layer 46 are formed on the surface of anode 44 and oxide 35. Oxide 45 and subsequent oxide layers 47 and 49 serve as thick dielectrics to isolate the metal contacts 36 and 48. To make contacts in the structure, a conventional interlevel metallization process using a titanium nitride, tungsten plug, and aluminum may be used. Alternatively, a copper damascene process could be used to make the contacts. To improve the fill factor of the SPAD device, a conventional microlens 50 with a top surface anti-reflection coating or a bottom surface anti-reflection coating 51 is centered on the SPAD device structure.

In other embodiments, the doping may be reversed such that element 44 forms the cathode of the SPAD device and element 40 forms the main portion of the anode of the SPAD device. In such embodiments, the substrate 20 may be a p-type substrate that does not require an n-well 22 to connect to the anode of the SPAD device. Alternatively, the substrate may be an n-type substrate with a p-well, rather than the n-well 22, and have p+ regions 25 and 26, which aid in the formation of a low resistance contact to the p-well in the substrate.

Figure 2:
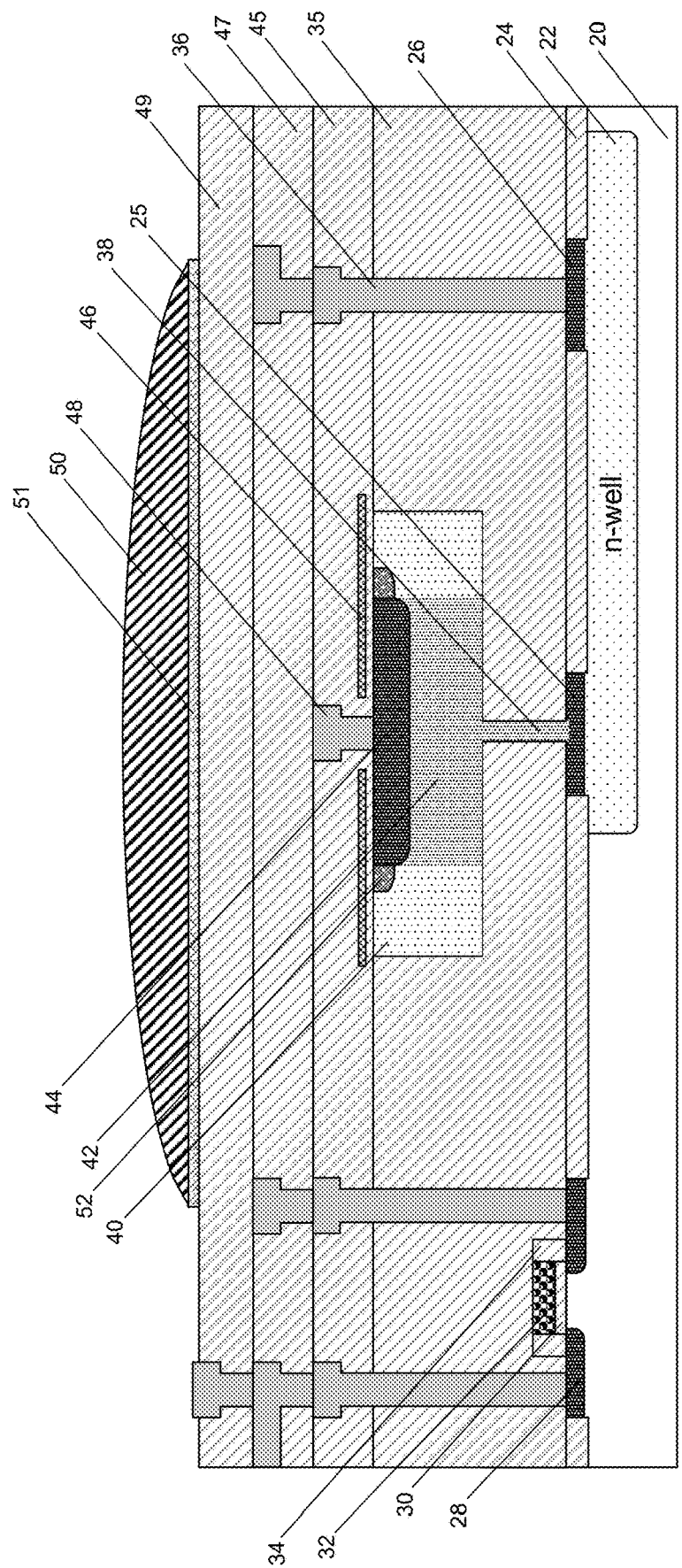
FIG. 2 is a schematic cross-sectional view of a completed SPAD device structure according to embodiments of the present invention with the p-n junction intersecting the top oxide interface and a conventional MOS transistor.

FIG. 2 shows an alternative embodiment where a circularly or near circularly patterned photoresist centered within the epitaxially grown, substantially defect-free Ge region 40 defines the heart of the device. A region 42 doped n-type defines a main portion of the cathode of the SPAD (along with region 40 and trench 38) and determines the breakdown voltage. Using the same lithographic pattern, a heavily doped p-type region 44 is implanted with boron to form a main portion of the anode of the SPAD device. Using an additional lithographic step or tilted ion implants, a p-type doped guard ring 52 having lower doping than region 44 may be formed and functions as part of the anode of the SPAD device. A p-n junction that is bounded by the top oxide 45 interface makes the device easier to passivate. In this embodiment, the substantially defect-free region 40 includes region 42.

Figure 3:
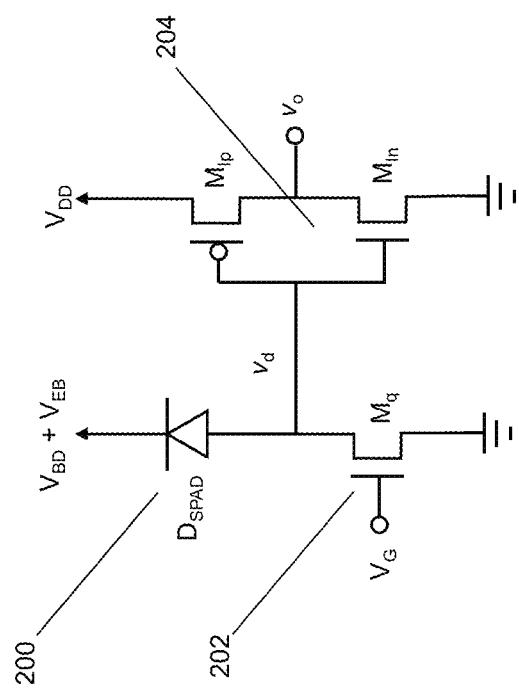
FIG. 3 is a schematic circuit diagram of a single SPAD anode connected to the quench transistor and pulse generating CMOS inverter according to embodiments of the present invention.

FIG. 3 shows the circuit schematic for a single SPAD device $D_{SPAD}$ 200 with quench transistor $M_q$ 202 and inverter circuit 204 composed of transistors $M_{In}$ and $M_{Ip}$. When an avalanche event is created within the SPAD in the substantially defect-free region 40, 42, the inverter circuit creates a pulse which is sent to the time measurement circuit. The quench transistor $M_q$ could be replaced with a polycrystalline silicon resistance readily available within the CMOS process if desired with a likely increase in total device area. The quench transistor $M_q$ is biased with gate voltage $V_G$ to place it in linear mode acting as a constant resistance. The cathode of the SPAD is biased with a voltage exceeding the device breakdown voltage ($V_{BD}$) by an amount $V_{EB}$. Before an incoming photon triggers an avalanche, the drain voltage $v_d$ of the quench transistor $M_q$ is near zero and $v_o$ is held at a logic 1 state. Once an avalanche is triggered by an absorbed photon or generated trap carrier injected into the avalanche region of the junction, a large current flows through the SPAD until the voltage across the SPAD is reduced to the breakdown voltage. The voltage $v_d$ rises to near $V_{EB}$ changing the logic state of the inverter output $v_o$ to 0. $V_{EB}$ must be limited to less than the $V_{DD}$ permitted by the CMOS process to avoid transistor damage.

Figure 4:
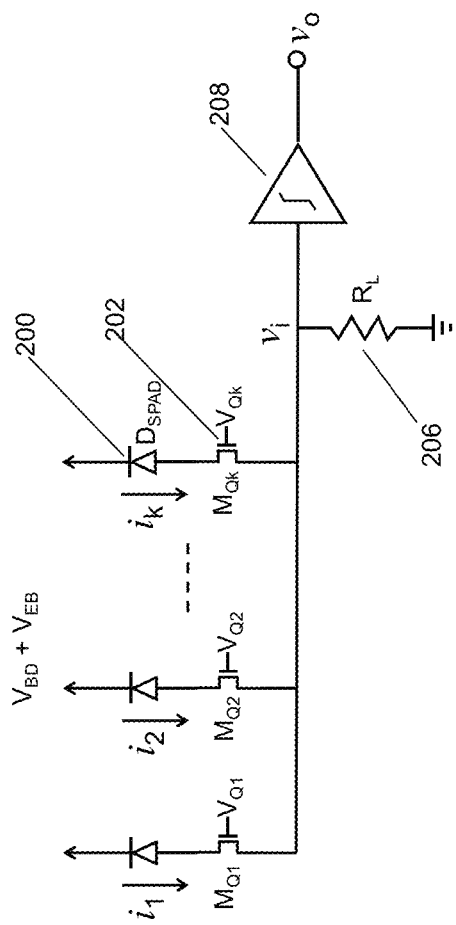
FIG. 4 is a schematic circuit diagram of a solid state photomultiplier which includes multiple SPAD anodes connected to individual quench transistors and a single pulse generating threshold circuit according to embodiments of the present invention.

FIG. 4 shows a schematic representation of a solid state photomultiplier (SSPM) circuit allowing multiple SPADs 200 to be connected in parallel with their associated quench transistors 202. A SSPM may use a variety of materials other than the exemplary material germanium. For example, the SSPM may include InGaAs, HgCdTe, and/or strained layer superlattices based on InAs. In the SSPM, a load device (resistor or transistor) 206 allows a voltage at the input of comparator circuit 208 triggering a pulse when a predetermined voltage level is reached. The comparator circuit allows the set of parallel connected SPADs to be coupled to the time measurement circuit thus increasing the dynamic range of the pixel with the drawback of larger pixel pitch. When an incoming photon successfully initiates an avalanche event in a SPAD, it cannot detect another photon until the avalanche current is quenched and the diode recharged. This quench/recharge period is termed the dead time of the SPAD. By using multiple SPADs within a pixel, the probability of being blinded to incoming photons is reduced exponentially thus improving the dynamic range. Increased dynamic range is especially important when operating in high background light conditions such as bright sunlight outdoors.

Figure 5:
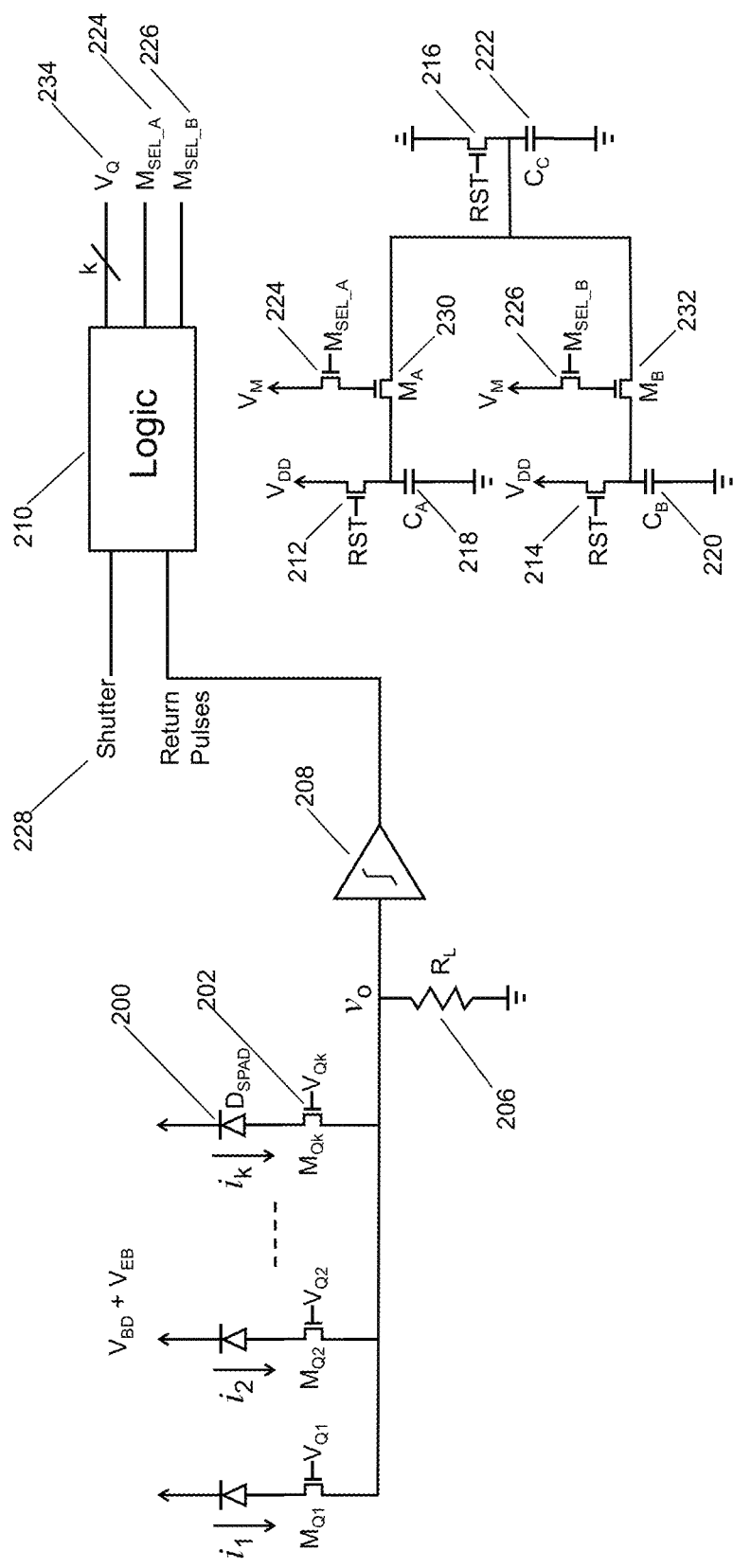
FIG. 5 is a block diagram of a solid state photomultiplier connected to a time-to-analog converter measurement circuit according to embodiments of the present invention.
Figure 6:
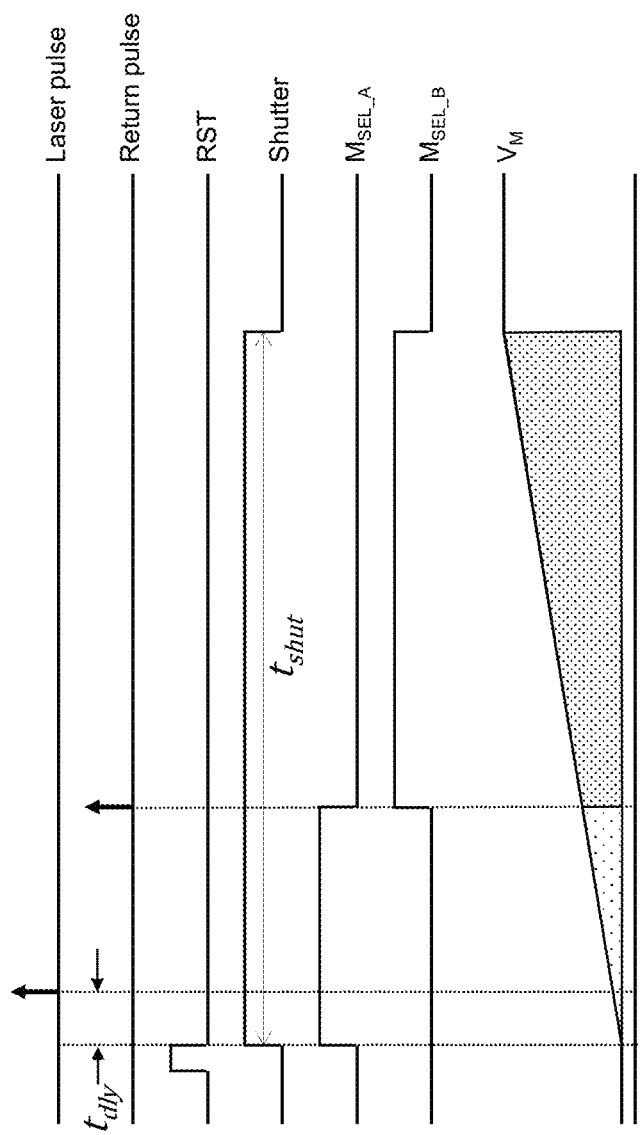
FIG. 6 is a simplified timing diagram of the time-to-analog converter measurement circuit according to embodiments of the present invention.

FIG. 5 shows the block diagram of the multi-SPAD configuration with the comparator circuit 208 connected to the logic block 210 of a time-to-analog converter (TAC). Referring also to the timing diagram illustrated in FIG. 6, we will explain the operation of the circuit. A reset signal RST is applied to transistors 212, 214, and 216 to set the initial voltage level on the capacitors $C_A$ 218 and $C_B$ 220 to $V_{DD}$ while the voltage is set to ground on $C_C$ 222. After the reset signal returns to zero, the Shutter signal 228 is sent high which instructs the logic block 210 to send the $M_{SEL\_A}$ signal high. Simultaneously with the Shutter signal, the ramp voltage $V_m$ at the drains of transistors $M_{SEL\_A}$ 224 and $M_{SEL\_B}$ 226 is initiated. During this period, $V_m$ is applied to the gate of transistor $M_A$ 230 which acts as a source follower transferring charge from $C_A$ to $C_C$ keeping the voltage of the node at the top of $C_C$ to a threshold voltage below $V_m$. After some known delay (positive or negative), $t_{dly}$, the laser pulse is launched. Once a return is detected by the SSPM and a pulse sent by the comparator, $M_{SEL\_A}$ is brought low and $M_{SEL\_B}$ is sent high by the logic block. Charge is now transferred from $C_B$ to $C_C$ with $M_B$ 232 acting a source follower to pin the voltage on $C_C$ to a threshold voltage below $V_m$. At the conclusion of the shutter period, Shutter and $M_{SEL\_B}$ are sent low and the charge on $C_A$ and $C_B$ is read out to determine the time-of-flight of the laser pulse according to the following equation, $$ToF = \frac{V_{TA} + \frac{C_A}{C_C}(V_{DD} - V_A)}{V_{TB} + \frac{C_A}{C_C}(V_{DD} - V_A) + \frac{C_B}{C_C}(V_{DD} - V_B)} t_s - t_{dly}$$

Where $V_A$ is the voltage present on $C_A$ and $V_B$ is the voltage on $C_B$ at the conclusion of the shutter period $t_s$. Fixed patterned noise correction is necessary to account for any differences in the threshold voltages of $M_A$ and $M_B$ to improve the accuracy of the measurement. Also, the values of the capacitors need to be chosen such that the voltages on $C_A$ and $C_B$ never fall below the voltage on $C_C$ thus $C_C > C_A$, $C_B$. Finally, the bias voltage $V_Q$ 234 controlled by the TAC logic can remove defective SPAD cells from the pixel by adjusting the biases $V_{Qk}$ to zero on the gates of the quench transistors $M_{Qk}$ 202 in each cell.

Figure 7:
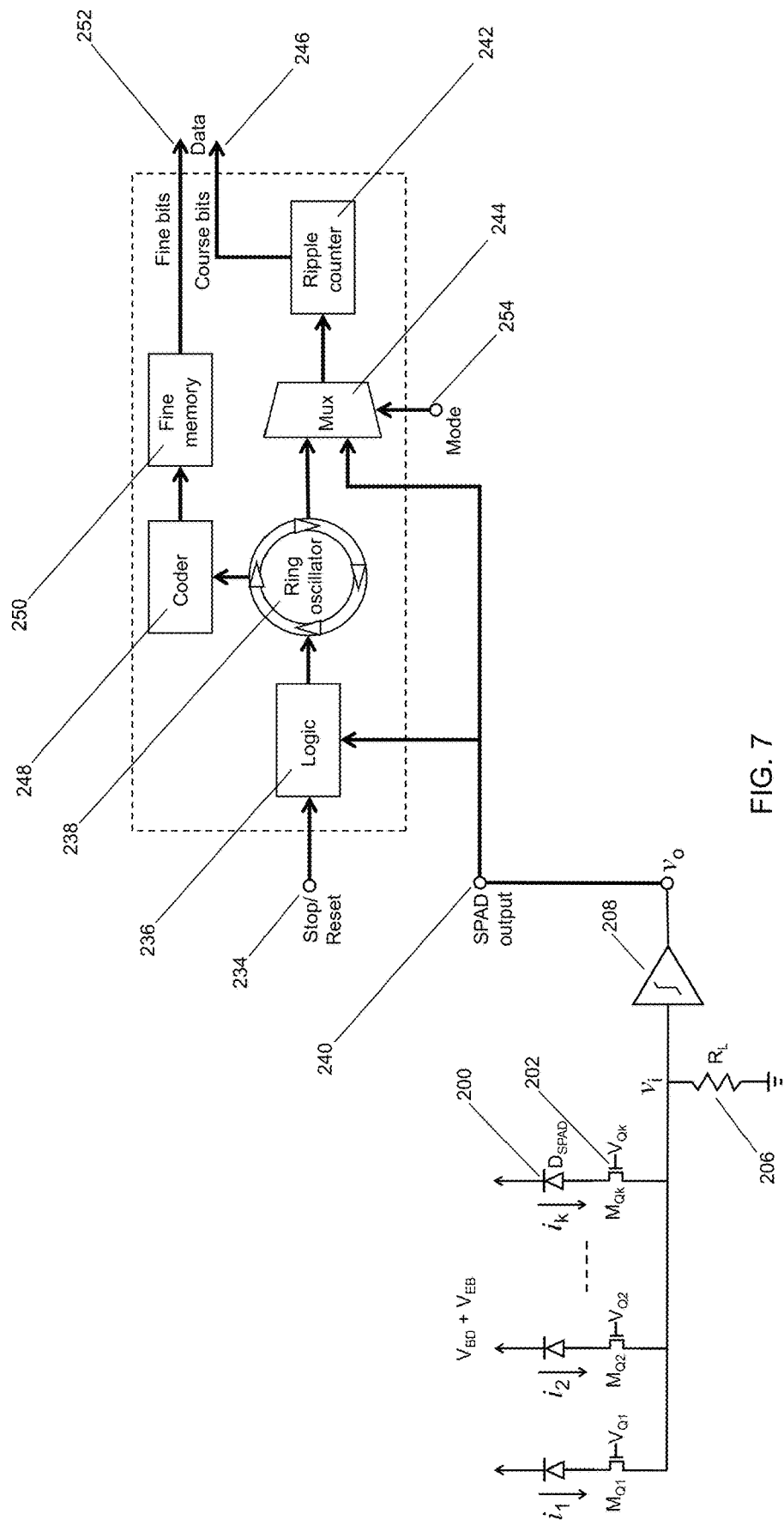
FIG. 7 is a block diagram of a solid state photomultiplier connected to an exemplary time-to-digital converter according to embodiments of the present invention.

FIG. 7 shows an example block diagram of a SSPM connected to an area and power efficient TDC using a ring oscillator and ripple counter operating in reverse start/stop mode. An illumination laser fires regularly with period $T_L$ setting up the measurement sequence. The maximum range to be measured must be less than $cT_L/2$ where c is the speed of light. For an exemplary 400 m range, $T_L$ must be greater than 2.67 µs implying the laser pulse frequency must be less than 375 kHz. The TDC operation begins with a signal from the illumination source at stop/reset node 234 indicating a pulse has been sent. The signal is transmitted through the logic block 236 to the ring oscillator 238 stopping its operation. The ring oscillator shuts down until a pulse from the SPAD is received at SPAD output 240 and transmitted through the logic block to the ring oscillator. The ring oscillator starts operating at the receipt of the SPAD pulse. For each period of the ring oscillator, the ripple counter 242 is incremented through multiplexer 244 generating the course time bits appearing at the data output 246. The next pulse from the illumination source triggers stop signal 234 which halts the ring oscillator through logic gates 236. The state of the ring oscillator is read by coder block 248 and placed into fine memory block 250. The fine memory bits 252 form the least significant bits of the time-of-flight data at the output of the TDC.

Figure 8:
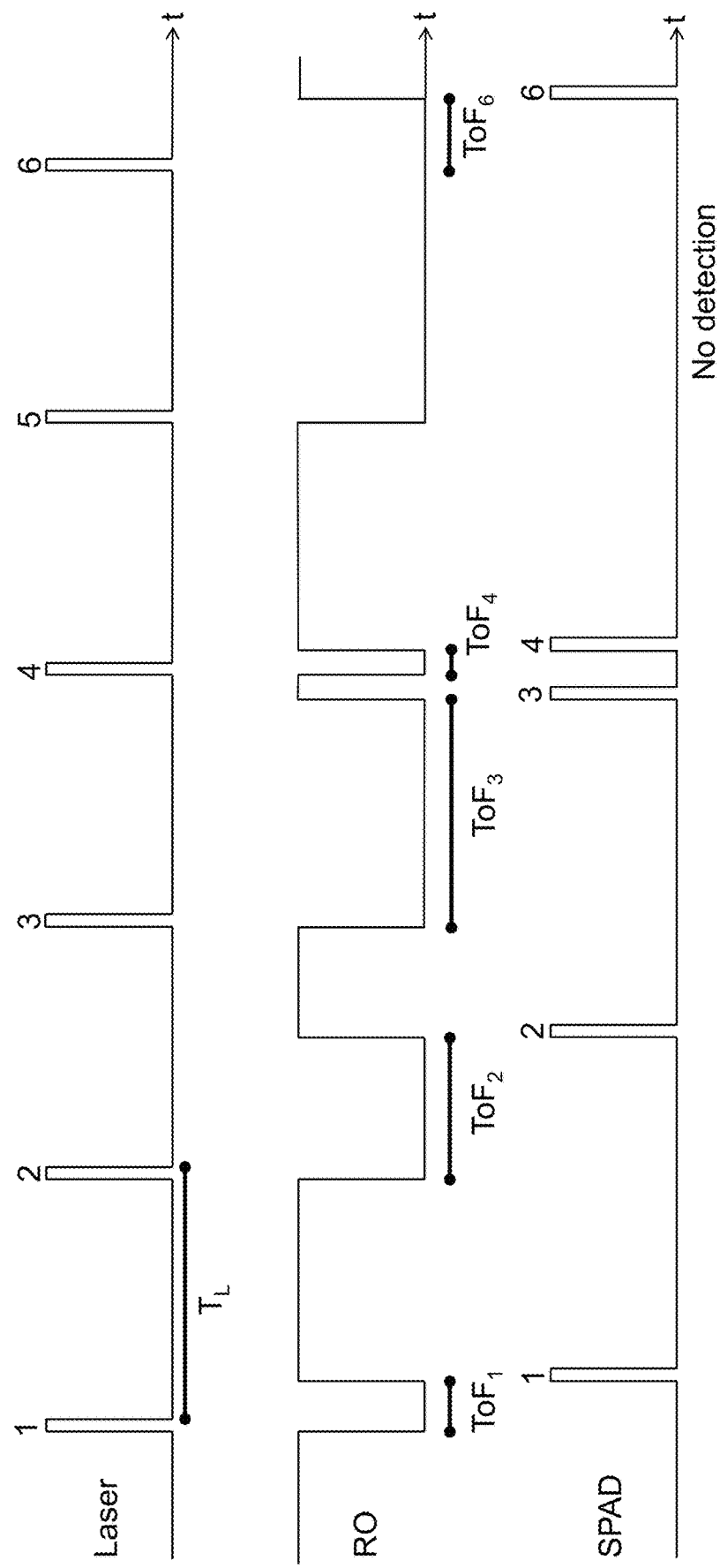
FIG. 8 is a simplified timing diagram of a system using a time-to-digital converter according to embodiments of the present invention.

FIG. 8 shows a simplified timing diagram of the TDC operating in reverse start/stop mode with a variety of returns indicating long, short, and no-return range information. The pulse train marked "Laser" indicates the voltage with time at node 234 in FIG. 7 while the pulse train marked "SPAD" indicates the voltage level (arbitrary units) at node 240 in FIG. 7. The logic state of the ring oscillator with time (t) is indicated by the label "RO." The laser pulse train deactivates the ring oscillator with period $T_L$ as shown in the diagram (when a laser pulse is received, the logic state RO goes low). Likewise, when a pulse is received from the SPAD, the ring oscillator logic state goes high indicating activation of the ring oscillator. The time-of-flight (ToF in FIG. 8) is derived from the illumination source period and the time of the pulse received from the SPAD as indicated for each of the six laser pulses exhibited in FIG. 8. In the case of laser pulse 5, no return was detected and thus the ring oscillator was shut down for a period exceeding $T_L$ until the return from laser pulse 6 was received by the SPAD. Reverse start/stop mode is power advantageous when operating in a low photon yield environment since the ring oscillator only operates when a photon return is detected. There may be other situations where the forward mode is advantageous such as the situation where many measurements are made at short range. By changing the logic block 236, forward mode could be enabled rather than reverse mode.

FIG. 7 also shows how the TDC circuit can function in photon counting mode through activation of node 254. In this mode, the ring oscillator is bypassed and the SPAD pulse is passed directly through Mux 244 to the ripple counter where it is incremented. This mode allows for an intensity image of the scene to be generated similar to a standard image sensor.

Figure 9:
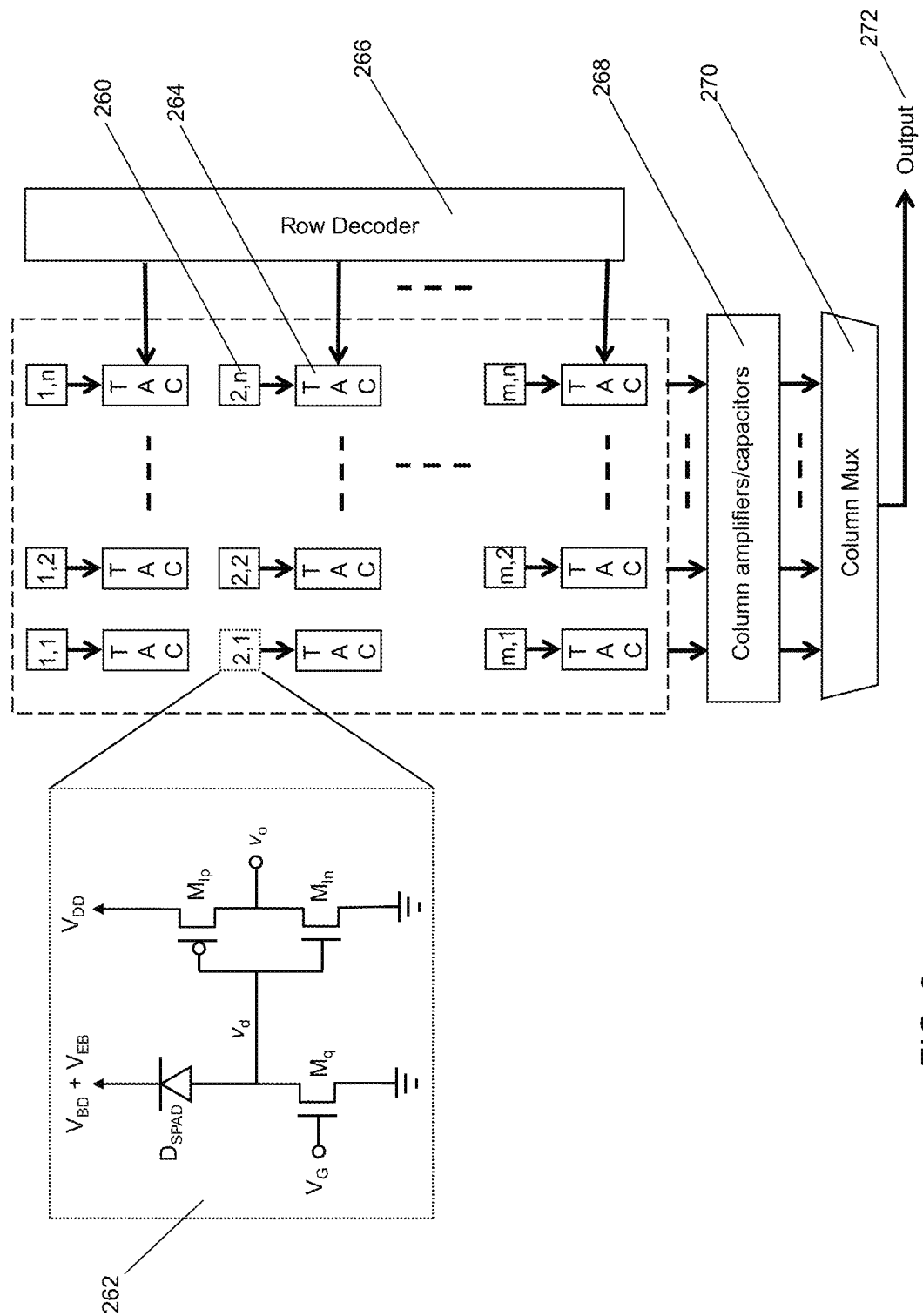
FIG. 9 is a block diagram of a two-dimensional array of SPADs using a time-to-analog converter with readout electronics as well as the circuit schematic of the SPAD connected to the quench transistor and pulse generating inverter according to embodiments of the present invention.

FIG. 9 displays a block diagram of an m×n array using a TAC for the time measurement. Each pixel in this 2-D array contains the SPAD unit cell 260, which includes the SPAD, quench transistor, and CMOS inverter serving as a pulse generator as depicted in the inset circuit schematic diagram 262. In one embodiment, the SSPM configuration depicted in FIG. 4 could be substituted for the single SPAD configuration 262 to increase the dynamic range of the pixel with the cost of increasing the pixel pitch. Each pixel also contains a TAC measurement circuit 264 to record the time-of-flight of photons imaged in the instantaneous field-of-view of the pixel. To extract the time-of-flight information from each pixel, the charge present on the TAC capacitive elements is read out row-by-row as in a standard CMOS image sensor. The row decoder 266 selects the row to be read and the charge is read out to the column capacitor/amplifier circuit 268. The column multiplexer 270 delivers these charge values to an analog-to-digital converter (ADC) present on-chip or external to the chip. The target range for each pixel is calculated from these digital values for the entire field-of-view.

Figure 10:
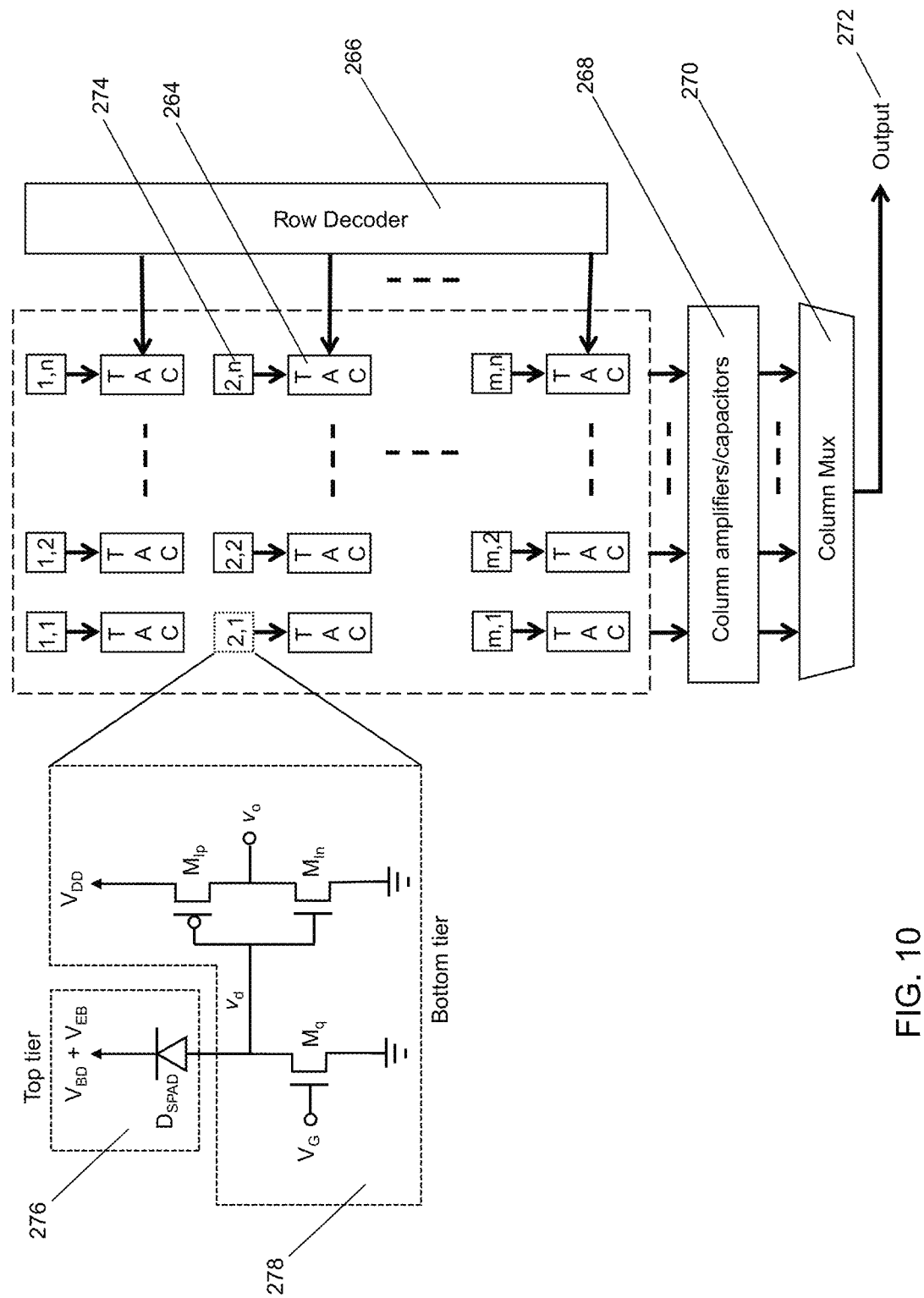
FIG. 10 is a block diagram of a wafer bonded two-dimensional array of SPADs using a time-to-analog converter with its readout electronics as well as the circuit schematic of the SPAD connected to the quench transistor and pulse generating inverter according to embodiments of the present invention.
Figure 11:
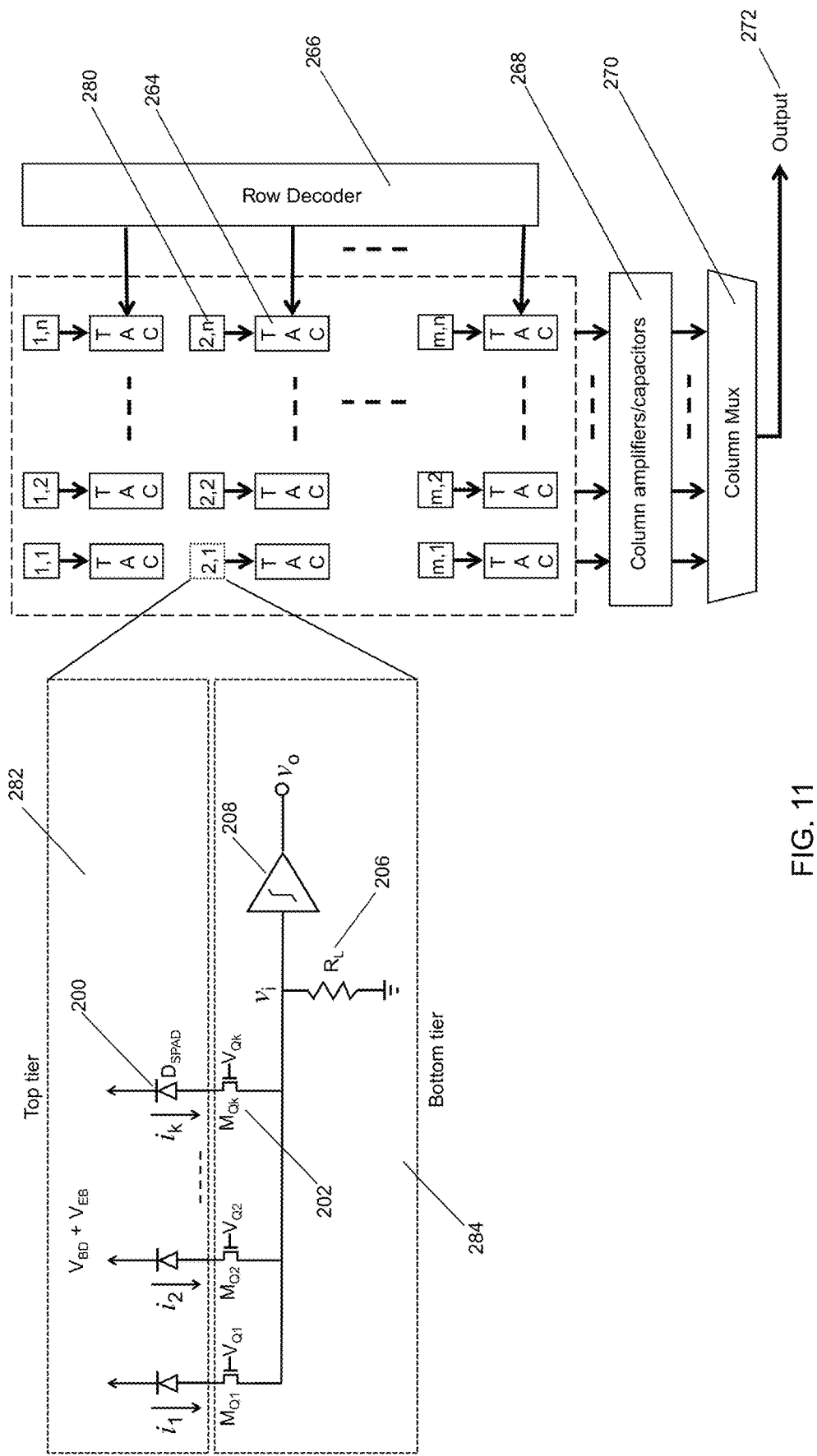
FIG. 11 is a block diagram of a wafer bonded two-dimensional array of solid state photomultipliers using a time-to-analog converter with its readout electronics according to embodiments of the present invention.

FIG. 10 displays a block diagram of an m×n array using a TAC for the time measurement with the SPAD devices produced on a top tier separate wafer and subsequently bonded to the readout and associated electronics using Cu2Cu bonding to a bottom tier wafer. Each pixel in this 2-D array contains the SPAD unit cell 274, which includes the SPAD, quench transistor, and CMOS inverter serving as a pulse generator as depicted in the inset circuit schematic diagrams 276 and 278. By bonding the SPAD 276 in a separate wafer, the fill factor is dramatically improved while improving performance and reducing cost since better matching of device requirements to the CMOS node is accomplished. The quench transistor, inverter circuit, TAC, and readout electronics may be optimally produced using a more advanced CMOS node than the SPAD due to the reduced design rules and power consumption. Furthermore, FIG. 11 shows the single SPAD device replaced with a SSPM configuration 282 in the top tier wafer. The quench, comparator, and load resistor elements 284 as well as the TAC and read elements are included in the bottom tier wafer. The readout operation proceeds as previously described for the TAC time measurement circuit.

Figure 12:
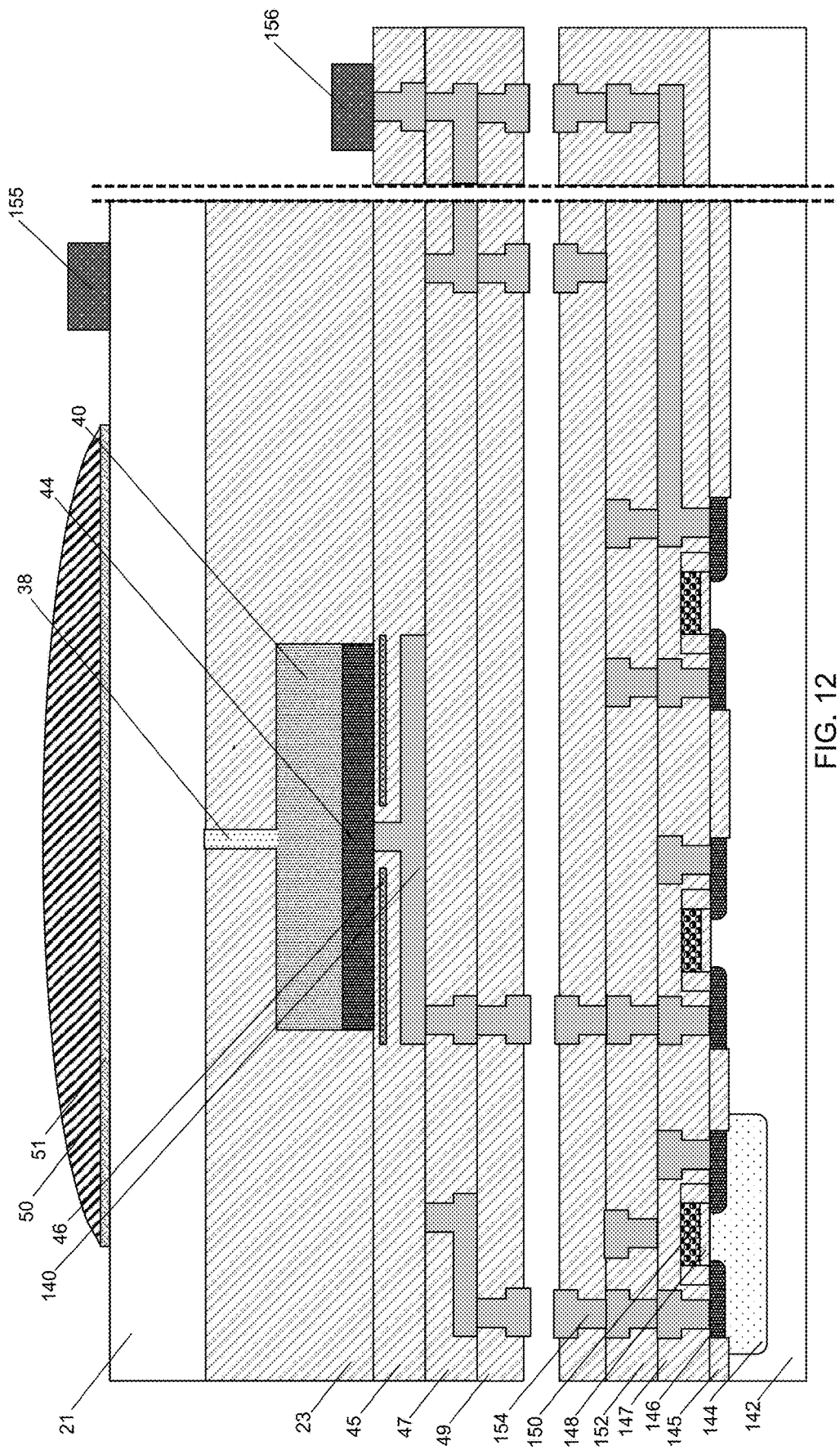
FIG. 12 is a schematic cross-sectional view of a two-dimensional array of SPADs showing an upper tier wafer containing the SPAD and lower tier wafer containing all the accompanying electronics according to embodiments of the present invention.

FIG. 12 shows an exemplary cross-section of the 2D SPAD array using the Cu2Cu bonded wafer approach referenced above. The upper tier is similar to the embodiment shown in FIG. 1, but the wafer is turned upside down to allow illumination to enter from the backside. Because only the SPAD exists in the upper tier wafer, more flexibility with substrate 21 choice is possible. The substrate could be heavily doped n-type with antimony, for example, allowing a contact 155 to the wafer backside. Although SWIR radiation finds the silicon substrate transparent, it is advantageous to thin or nearly remove the substrate to bring the microlens 50 closer to the SPAD and enable the detection of wavelengths less than 1100 nm. The substrate thinning process must be careful not to remove the n-well or the n+ cathode contacts if present. The oxide 23 may not be limited to interlevel deposited dielectrics if a standard CMOS process is not used. One other notable exception to FIG. 1 is the use of metal 1 contact element 140 which covers the entire area of the SPAD device acting as a reflector for radiation not absorbed in the first pass. In addition, a different photon scattering layer 46 capable of functioning in a reflective mode rather than transmission mode takes advantage of the metal 1 reflector. A transmission mode scattering layer constructed on substrate 21 is also possible using, for example, polysilicon features. The CMOS node chosen for the upper tier wafer should have the top metal level including copper to facilitate the Cu-to-Cu bonding process. A transistor may be fabricated in the top tier wafer, but to maximize the fill factor all the transistor elements are optimally placed in the lower tier wafer where the CMOS node may be more advanced thus reducing transistor size and increasing performance.

The lower tier wafer of FIG. 12 should use a CMOS technology with top metal 154 being copper to facilitate the high density bonding process. The other principle regions in the lower tier CMOS wafer include the substrate 142, isolation oxide 145, n-well 144, n+/p+ source/drain 146, gate oxide 148, polysilicon or metal gate 150, interlevel dielectric 147, intermetal dielectric 152, and metalization 154. To form the 2D SPAD array, the top and bottom tier wafers are bonded together using Cu-to-Cu bonding, a modern CMOS technique, to make excellent contact between the top metal copper layers of different wafers. To make bond pads to the image sensor, the substrate 21 and oxide 23 are removed in the periphery of the chip and bond pad metal 156 is deposited and patterned. Alternatively, through silicon vias (TSV) could be formed through the lower tier wafer to make bond pads to the backside of the bonded 3D structure.

Figure 13:
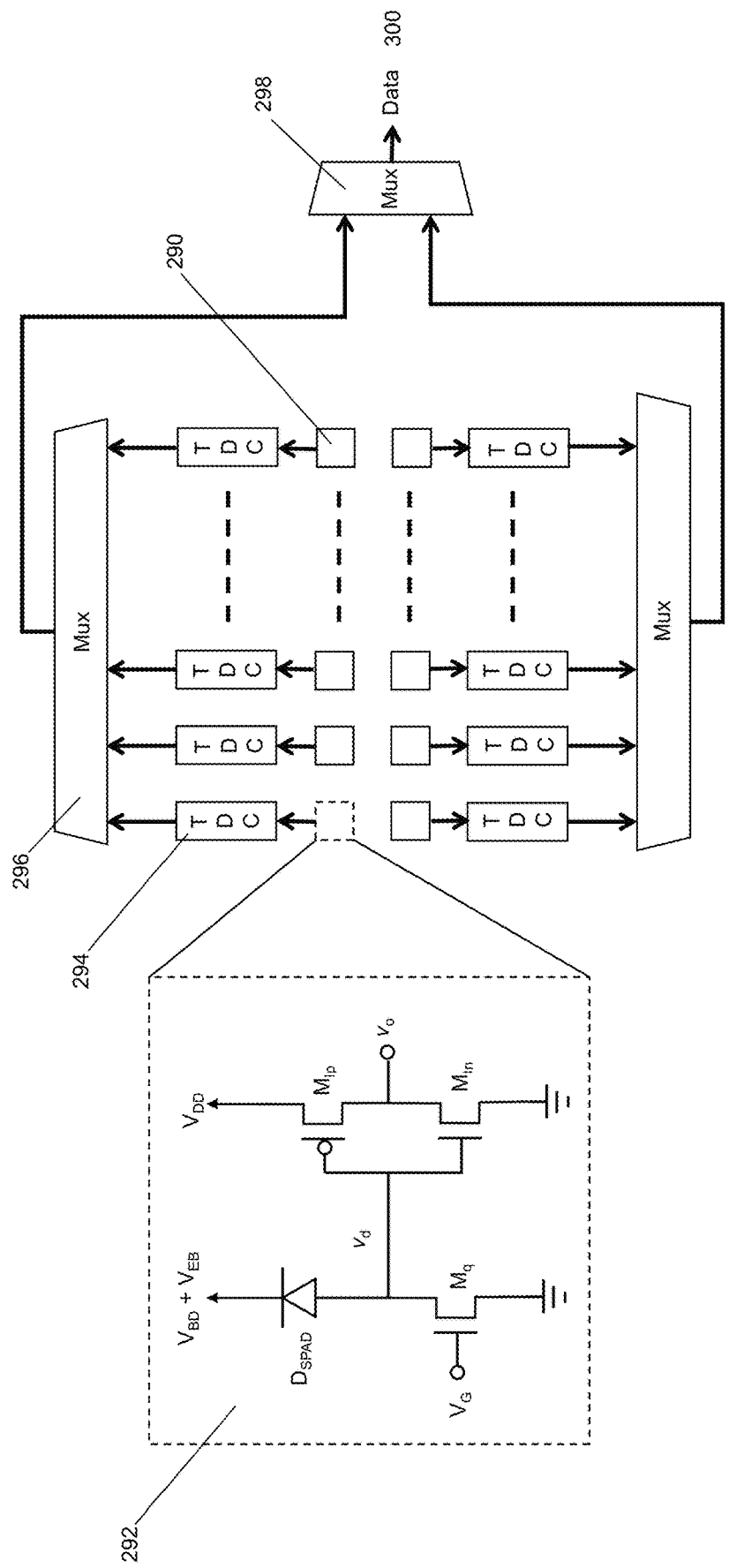
FIG. 13 is a block diagram of a two row SPAD array using a time-to-digital converter along with a circuit diagram showing the SPAD, quench transistor, and pulse generating inverter according to embodiments of the present invention.

FIG. 13 shows a block diagram of a two-row SPAD array using the TDC time measurement circuit. Because the TDC requires more circuit elements than the TAC circuit, this two row architecture is important since it is likely the largest array that can be implemented on a single chip without wafer bonding. The SPAD cell with quench transistor and pulse generating CMOS inverter 290 is detailed within the inset circuit schematic 292. The SPAD cell 290 is connected to a dedicated time-to-digital converter (TDC) 294 where the time-of-flight of the emitted photon is measured. The outputs of each TDC in the first row are directed into Mux 296 which is fed into Mux 298 to combine with data from the other row. The serialized data 300 is used to form an image with range information for each of the pixels in the rows. The SPAD unit cell with a single detector may be replaced with the SSPM configuration of FIG. 4 to increase the dynamic range of the device at a cost of increasing the pixel pitch. It is also possible to include on chip image processing functions such as histogram creation, non-uniformity correction, nearest neighbor photon detection correlation or other calculation tasks to improve data and image quality.

Figure 14:
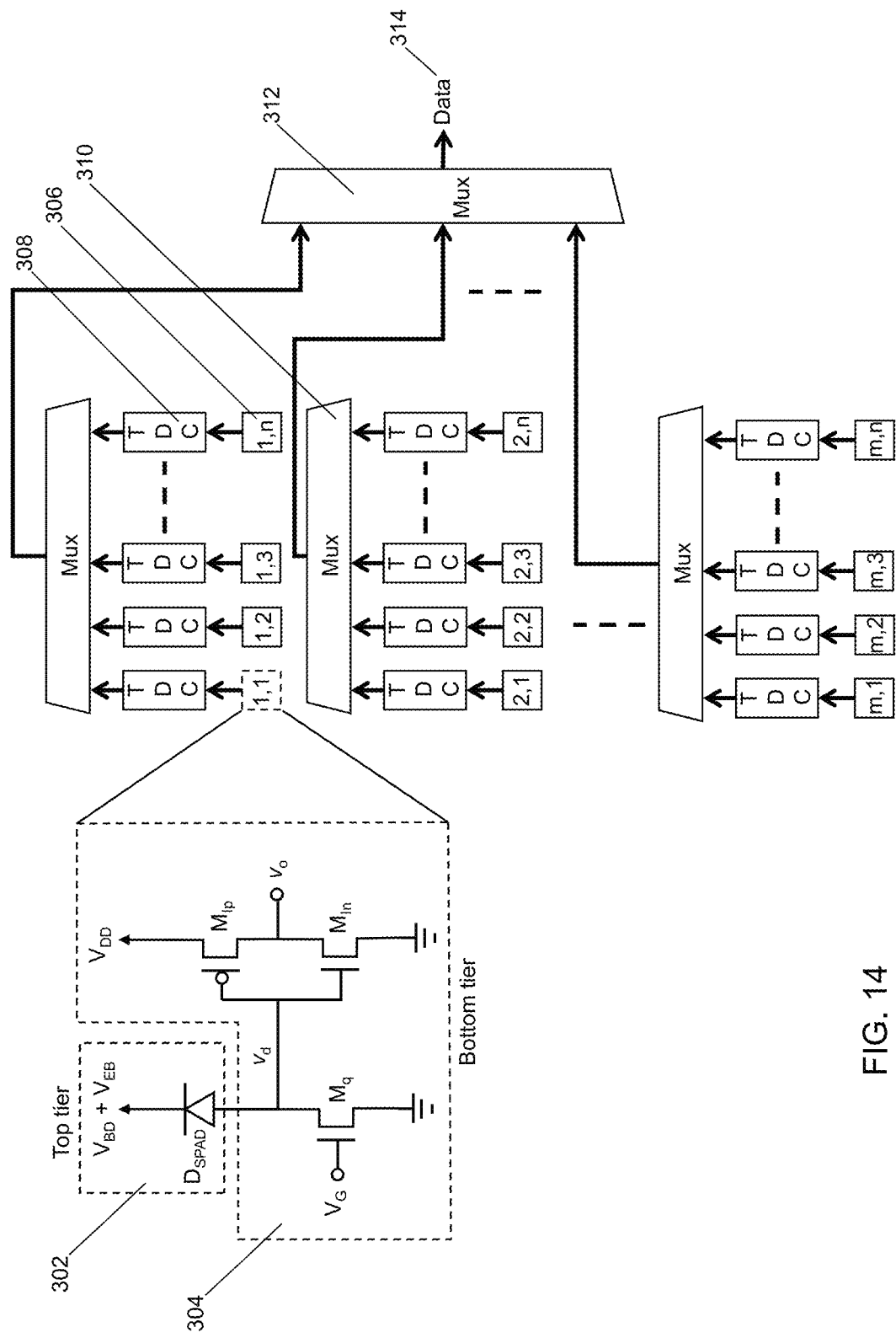
FIG. 14 is a block diagram of a two-dimensional array of SPADs using time-to-digital converters as well as the circuit schematic of the SPAD connected to the quench transistor and pulse generating inverter according to embodiments of the present invention.

FIG. 14 illustrates a block diagram of a two-dimensional Ge SPAD image sensor with m rows and n columns using a TDC 308 for the time measurement with the SPAD devices 302 produced on a top tier wafer and subsequently bonded to the quench, inverter, readout and associated electronics using Cu2Cu bonding to a bottom tier wafer. Each pixel in this 2D array contains the SPAD unit cell 306, which includes the SPAD, quench transistor, and CMOS inverter serving as a pulse generator as depicted in the inset circuit schematic diagrams 302 and 304. Each pixel is connected to a row multiplexer 310 which is further connected to an array multiplexer 312. The serialized data 314 is read out using digital circuitry to form an image with range information from each pixel. By bonding the SPAD 302 from a separate wafer, the fill factor is dramatically improved while improving performance and reducing cost since better matching of device requirements to the CMOS node is accomplished. The quench transistor, inverter circuit, TDC, and readout electronics may be optimally produced using a more advanced CMOS node than the SPAD due to the reduced design rules and power consumption.

Figure 15:
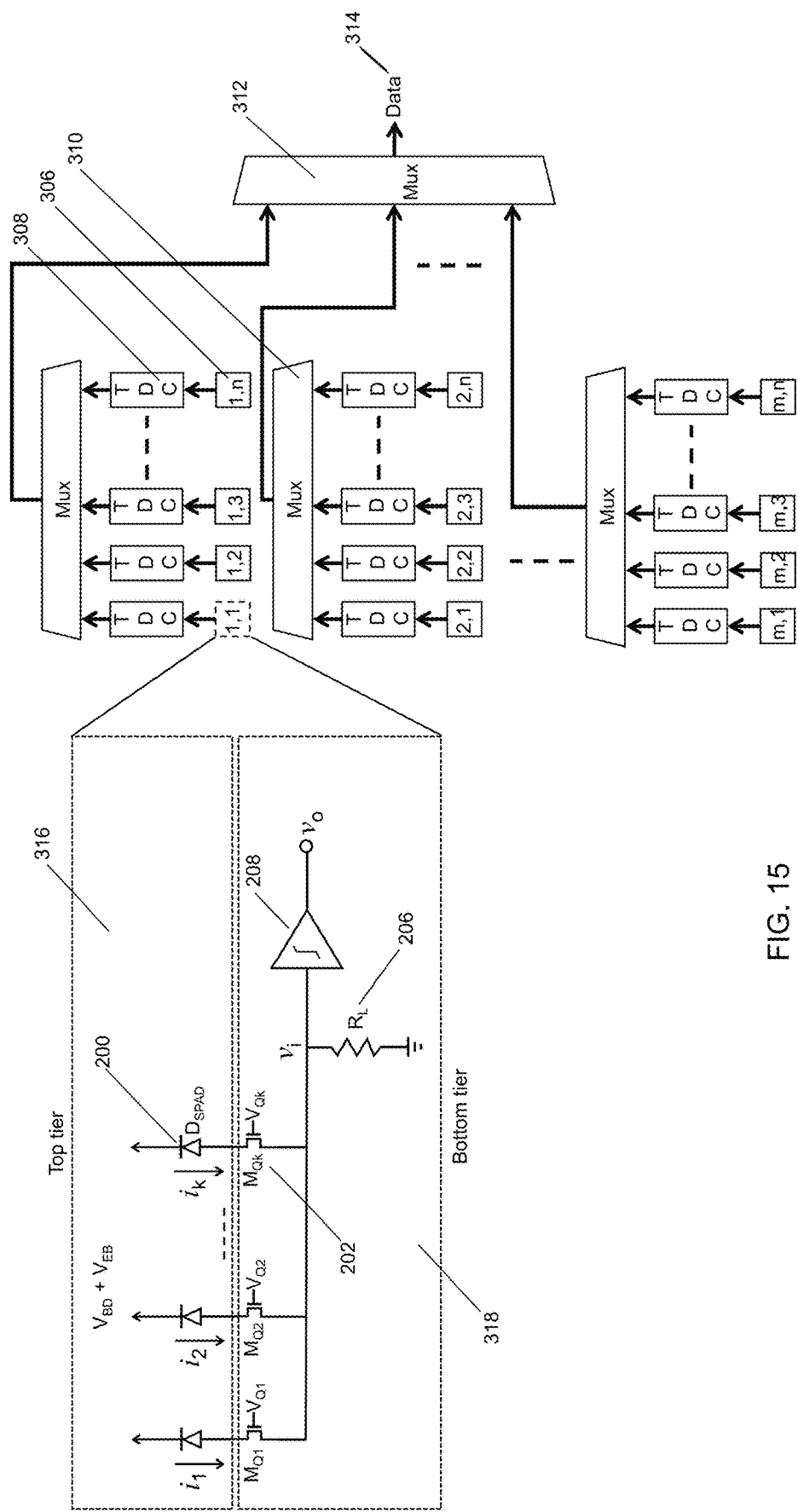
FIG. 15 is a block diagram of a two-dimensional array of solid state photomultipliers connected to time-to-digital converters and readout electronics using a wafer bonding approach according to embodiments of the present invention.

FIG. 15 shows an m×n array with a SSPM configuration 316 in the top tier wafer. The quench, comparator, and load resistor components 318 as well as the TDC and read elements are included in the bottom tier wafer. The readout does not change with a SSPM arrangement at the input. As with the other configurations, it is also possible to include on chip image processing functions such as histogram creation, non-uniformity correction, nearest neighbor photon detection correlation, or other calculation tasks to improve data and image quality. In the case of this 2D imager, the SPAD device is best fabricated on a separate wafer to improve fill factor and bonded using CMOS copper-to-copper wafer bonding techniques. With this configuration in mind, the quench transistor, pulse generator, TDC, readout circuitry, and all downstream image processing would exist on a separate wafer likely using a more advanced CMOS node than the SPAD wafer.

Figure 16:
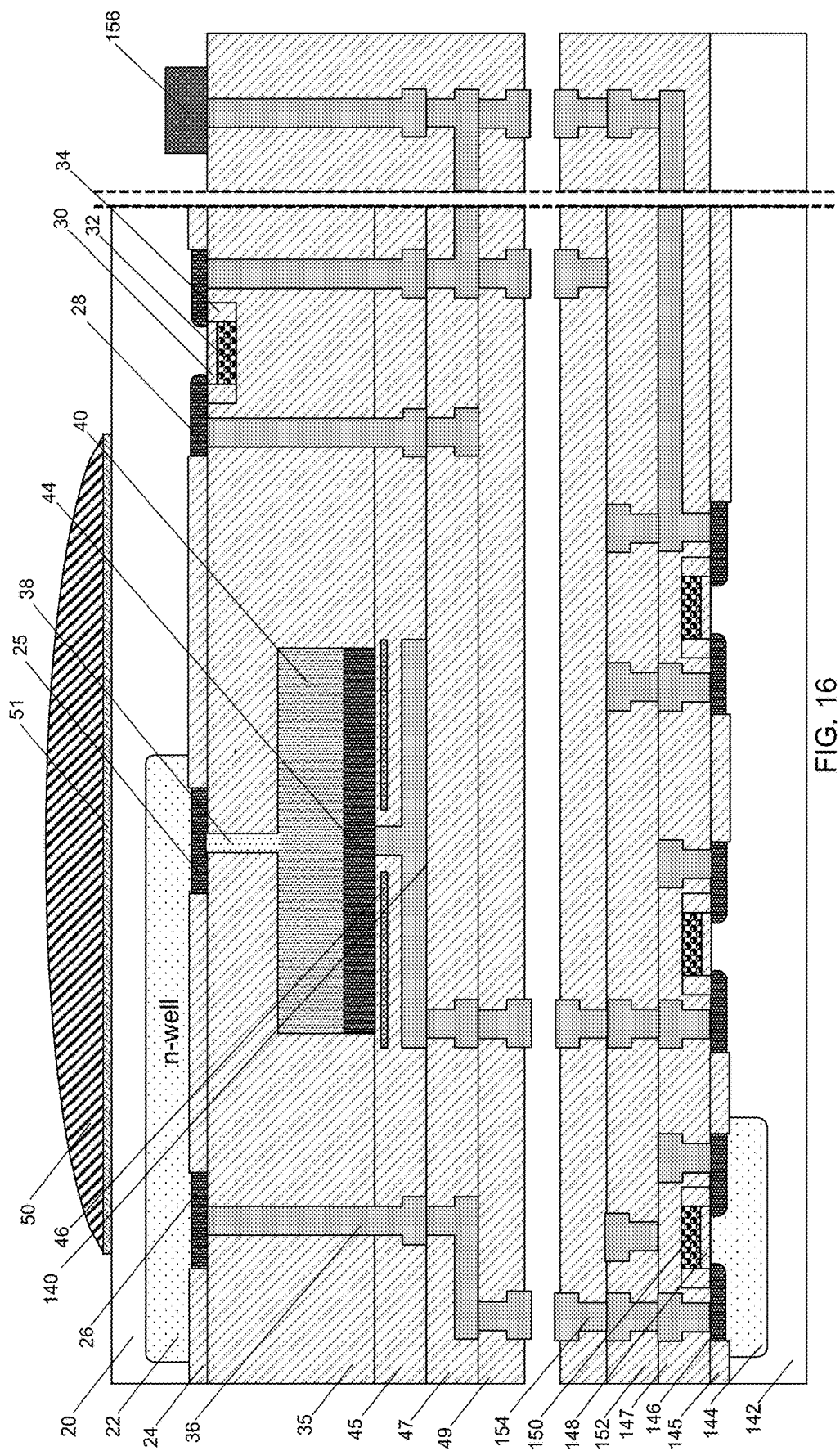
FIG. 16 is a schematic cross-sectional view of a two-dimensional array of SPADs showing an upper tier wafer containing the SPAD and lower tier wafer containing all the accompanying electronics according to embodiments of the present invention.

FIG. 16 shows the cross-section of the 2D SPAD array using the Cu2Cu bonded wafer approach referenced above. The upper tier wafer largely conforms to the discussion for FIG. 1 with the wafer turned upside down to allow illumination to enter from the backside. Although SWIR radiation finds the silicon substrate transparent, it is advantageous to thin or nearly remove the substrate to bring the microlens closer to the SPAD and enable the detection of wavelengths less than 1100 nm. The substrate thinning process must be careful not to remove the n-well 22 or the n+ cathode contacts 25 and 26. In this embodiment, metal 1 contact element 140, which covers the entire area of the SPAD device, acts as a reflector for radiation not absorbed in the first pass. In addition, a different photon scattering layer 46 capable of functioning in a reflective mode rather than transmission mode takes advantage of the metal 1 reflector. A transmission mode scattering layer constructed on substrate 20 is also possible using, for example, polysilicon features. The CMOS node chosen for the upper tier wafer should have the top metal level including copper to facilitate the Cu-to-Cu bonding process. While FIG. 16 shows a transistor fabricated in the top tier wafer, to maximize the fill factor all the transistor elements are optimally placed in the lower tier wafer where the CMOS node may be more advanced, thus reducing transistor size and increasing performance.

The lower tier wafer of FIG. 16 also must also use a CMOS technology with top metal 154 being copper to facilitate the high density bonding process. The other principle regions in the lower tier CMOS wafer include the substrate 142, isolation oxide 145, n-well 144, n+/p+ source/drain 146, gate oxide 148, polysilicon or metal gate 150, interlevel dielectric 147, intermetal dielectric 152, and metalization 154. To form the 2D SPAD array, the top and bottom tier wafers are bonded together using Cu-to-Cu bonding, a modern CMOS technique, to make excellent contact between the top metal copper layers of different wafers. To make bond pads to the image sensor, the substrate 20 is removed in the periphery of the chip and bond pad metal 156 is deposited and patterned. Alternatively, through silicon vias (TSV) could be formed through the lower tier wafer to make bond pads to the backside of the bonded 3D structure.

Figure 17B:
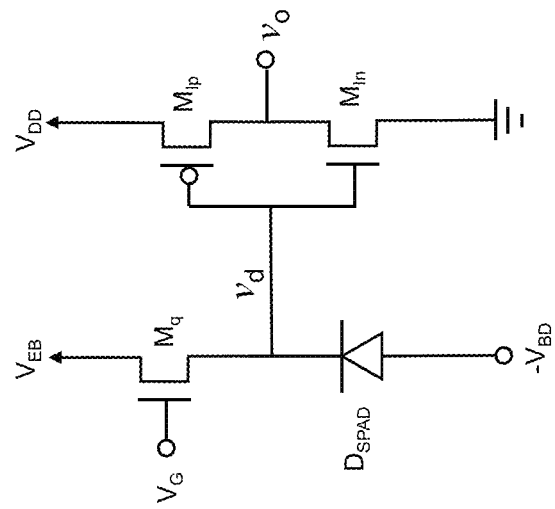
FIGS. 17A and 17B are schematic circuit diagrams showing two versions the SPAD cathode connected to the quench transistor and pulse generating CMOS inverter according to embodiments of the present invention.
Figure 17A:
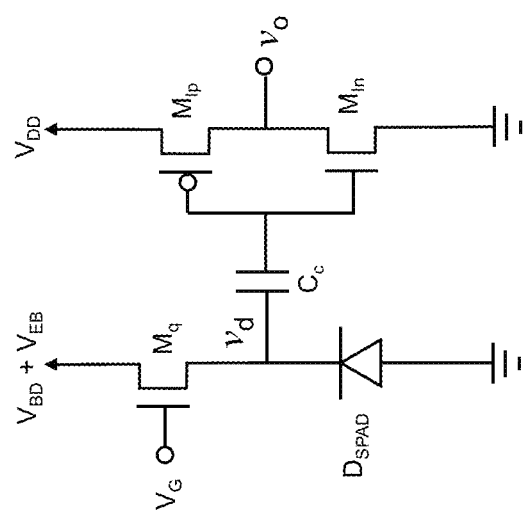

A top cathode structure is also possible, instead of a top anode contact structure, by reversing polarities of the described regions. In this case, the n-well is replaced with a p-well surrounded by n-well and deep n-well regions using CMOS techniques well known to those practicing the art. FIGS. 17A and 17B show circuit schematics of a quench transistor and output inverter in this embodiment. The quench transistor is connected to the cathode with operation proceeding as described above. To ensure the input voltage to the CMOS inverter does not exceed the $V_{DD}$ permitted by the CMOS process, the biasing scheme or schematic must change to ensure that voltages far exceeding $V_{DD}$ do not reach the input of the inverter. In FIG. 17A, a coupling capacitor $C_C$ is inserted between the SPAD cathode and the inverter input to protect the transistors while in FIG. 17B the drain voltage on $M_q$ is reduced to $V_{EB}$ ($V_{EB} \leq V_{DD}$) and $-V_{BD}$ appears on the SPAD anode. Both methods protect the CMOS transistors and allow the polarities of the SPAD device regions to be switched.

Although some embodiments are described with respect to a specific material, e.g., germanium, it should be realized that materials other than germanium may also be used. For example, a germanium alloy, such as silicon and germanium ($Si_{1-x}Ge_x$) where x is varied from 0 to 100 percent, may be used. Other examples of germanium alloys may include SiGeSn or GeSn. In the case of a germanium alloy, there would be a trade-off between the cutoff wavelength and the ultimate dark current possible in the SPAD device. For $Si_{1-x}Ge_x$, as the Ge fraction x is decreased, the dark current becomes lower and the cutoff wavelength also becomes smaller. Also, other semiconductor materials, such as InGaAs, HgCdTe, InSb, and InAs-based strained layer superlattices, may be used for the substantially defect free region on the substrate.

Although some embodiments are described with respect to a specific single photon avalanche detector device structure, it should be realized that the sequence is to be viewed as exemplary and not in a limiting sense. Other devices such as vertical p-i-n photodiodes, avalanche photodiodes, phototransistors, and other devices known to one skilled in the art could be formed in the crystalline Ge layer, while still achieving the same result of converting infrared light to an electrical signal.

Although the above discussion discloses various exemplary embodiments, those skilled in the art may make various modifications to or variations of the illustrated embodiments without departing from the inventive concepts disclosed herein.

The invention claimed is:

1. An image sensor array comprising:
a substrate; and
a plurality of pixels, each pixel comprising:
 a single photon avalanche detector (SPAD), the SPAD having (1) a trench coupled to the substrate and having a lattice mismatch with the substrate and (2) a substantially defect-free region coupled to the trench and configured to generate an avalanche current when a photon is detected in the region, wherein the trench and the defect-free region form an electrode;
 a quench device coupled to a respective SPAD and configured to quench the avalanche current; and
 time measurement circuitry configured to measure a time-of-flight of the photon.

2. The image sensor array of claim 1, wherein the lattice mismatch causes a dislocation defect which ends at a sidewall of the trench.

3. The image sensor array of claim 1, wherein the trench has an aspect ratio of at least 1.7 times higher than its width.

4. The image sensor array of claim 1, wherein the substrate comprises silicon.

5. The image sensor array of claim 1, wherein the trench comprises germanium or a germanium alloy.

6. The image sensor array of claim 1, wherein at least one pixel comprises a plurality of single photon avalanche detectors and a plurality of quench devices, each quench device coupled to a respective SPAD, the plurality of single photon avalanche detectors coupled to one another in parallel.

7. The image sensor array of claim 1, wherein the time measurement circuitry is a time-to-analog converter or a time-to-digital converter.

8. The image sensor array of claim 1, wherein the quench device is a transistor or resistor.

9. The image sensor array of claim 1, wherein the SPAD is on a first wafer and the quench device and the time measurement circuitry are on a second wafer, wherein the first wafer is bonded to the second wafer.

10. The image sensor array of claim 9, wherein the first wafer is bonded to the second wafer using a copper-to-copper bonding.

11. The image sensor array of claim 1, wherein each pixel further comprises a pulse generator configured to provide a signal to the time measurement circuitry.

12. The image sensor array of claim 11, wherein the pulse generator is an inverter or comparator.

13. The image sensor array of claim 1, wherein the time measurement circuitry further comprises a ring oscillator configured to activate or deactivate upon a pulse received from the SPAD.

14. The image sensor array of claim 13, wherein the ring oscillator can be operated in reverse mode or forward mode, wherein the time measurement circuitry is configured to switch the ring oscillator between the reverse mode and the forward mode.

15. The image sensor array of claim 1, wherein the plurality of pixels are arranged in an m by n array, the image sensor array further comprising a column multiplexer configured to receive data from the time measurement circuitry and to output range data.

16. The image sensor array of claim 15, the image sensor array further comprising:
    a row decoder configured to select a row of the plurality of pixels and to read a charge on the respective time measurement circuitry; and
    column capacitor and/or amplifier circuitry configured to read the charge on the respective time measurement circuitry.

17. An imaging system comprising:
    an infrared laser configured to provide a pulse of light; and
    the image sensor array of claim 1 configured to receive the pulse from the infrared laser.

18. The imaging system of claim 17, wherein at least one pixel comprises a plurality of single photon avalanche detectors coupled in parallel to one another.

19. The imaging system of claim 17, wherein the image sensor array detects range data from a field of view in a single pulse from the infrared laser.

20. The imaging system of claim 17, wherein the infrared laser has a period of greater than 2.67 microseconds.

* * * * *